(12) United States Patent
Thach et al.

(10) Patent No.: US 10,970,361 B2
(45) Date of Patent: Apr. 6, 2021

(54) INFORMATION PROCESSING APPARATUS, ISING DEVICE, AND INFORMATION PROCESSING APPARATUS CONTROL METHOD

(71) Applicant: FUJITSU LIMITED, Kawasaki (JP)

(72) Inventors: David Thach, Meguro (JP); Hirotaka Tamura, Yokohama (JP); Sanroku Tsukamoto, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 974 days.

(21) Appl. No.: 15/615,868

(22) Filed: Jun. 7, 2017

(65) Prior Publication Data

US 2017/0364477 A1   Dec. 21, 2017

(30) Foreign Application Priority Data

Jun. 17, 2016   (JP) .............................. JP2016-120717

(51) Int. Cl.
*G06F 17/11* (2006.01)
*G06N 5/00* (2006.01)
(Continued)

(52) U.S. Cl.
CPC .............. *G06F 17/11* (2013.01); *G06F 7/588* (2013.01); *G06F 13/20* (2013.01); *G06F 30/20* (2020.01);
(Continued)

(58) Field of Classification Search
CPC ............ G06N 3/04; G06N 3/08; G06N 3/063; G06N 3/0445; G06N 3/0472; G06N 99/00;
(Continued)

(56) References Cited

U.S. PATENT DOCUMENTS 5,293,457 A * 3/1994 Arima .................... G06N 3/063
706/34
5,581,659 A   12/1996 Takatori
(Continued)

FOREIGN PATENT DOCUMENTS

JP   7-200512   8/1995

OTHER PUBLICATIONS

Graf, Hans Peter, E. Sackinger, and Lawrence D. Jackel. "Recent developments of electronic neural nets in North America." Journal of VLSI signal processing systems for signal, image and video technology 6.1 (1993): 19-31. (Year: 1993).*

(Continued)

*Primary Examiner* — Kamran Afshar
*Assistant Examiner* — Randall K. Baldwin
(74) *Attorney, Agent, or Firm* — Fujitsu Patent Center

(57) ABSTRACT

Arithmetic circuits calculate d−1 energy values ($h_{i2}$ to $h_{id}$) indicating energies generated by 2-body to d-body coupling on the basis of a plurality of weight values indicating strength of 2-body to d-body coupling of 2 to d neurons including a first neuron whose output value is allowed to be updated and n-bit output values of n neurons. An adder circuit calculates a sum of these values, and a comparator circuit compares a value based on a sum of the sum and a noise value with a threshold, to determine the output value of the first neuron. An update circuit outputs n-bit updated output values in which one bit has been updated on the basis of a selection signal and the output value of the first neuron. The holding circuit holds the updated output values and outputs the updated output values as the n-bit output values used by the arithmetic circuits.

6 Claims, 21 Drawing Sheets

(51) Int. Cl.
- *G06N 3/04* (2006.01)
- *G06N 3/063* (2006.01)
- *G06N 7/00* (2006.01)
- *G06N 7/04* (2006.01)
- *G06F 30/20* (2020.01)
- *G06F 7/58* (2006.01)
- *G06F 13/20* (2006.01)

(52) U.S. Cl.
CPC ......... *G06N 3/0445* (2013.01); *G06N 3/0472* (2013.01); *G06N 3/063* (2013.01); *G06N 5/003* (2013.01); *G06N 7/005* (2013.01); *G06N 7/046* (2013.01)

(58) Field of Classification Search
CPC ............ G06N 7/00; G06N 7/04; G06N 7/046; G06N 7/005; G06N 5/003; G06F 1/28; G06F 17/11; G06F 17/50; G06F 17/5009; G06F 7/58; G06F 7/588; G06F 13/20; G06F 30/20
See application file for complete search history.

(56) References Cited

U.S. PATENT DOCUMENTS

| | | | | |
|---|---|---|---|---|
| 2013/0135439 | A1* | 5/2013 | Kakuko | H04N 13/00 348/46 |
| 2016/0064053 | A1* | 3/2016 | Yamaoka | G11C 7/222 711/103 |
| 2016/0065210 | A1* | 3/2016 | Yoshimura | H03K 19/0002 326/56 |
| 2017/0061326 | A1* | 3/2017 | Talathi | G06K 9/4628 |
| 2017/0351949 | A1* | 12/2017 | Matsubara | G06N 3/049 |
| 2018/0247691 | A1* | 8/2018 | Okuyama | G06N 7/005 |
| 2019/0155330 | A1* | 5/2019 | Yamaoka | G06F 15/80 |

OTHER PUBLICATIONS

Roudi, Yasser, Joanna Tyrcha, and John Hertz. "Ising model for neural data: model quality and approximate methods for extracting functional connectivity." Physical Review E 79.5 (2009): 051915. (Year: 2009).*

Honkela, Timo, et al., eds. Artificial Neural Networks and Machine Learning—ICANN 2011: 21st International Conference on Artificial Neural Networks, Espoo, Finland, Jun. 14-17, 2011, Proceedings. vol. 6792. Springer, 2011: I-390. (Year: 2011).*

Sathasivam, Saratha. "Boltzmann machine and new activation function comparison." Applied Mathematical Sciences 5.78 (2011): 3853-3860. (Year: 2011).*

Ravanbakhsh, Siamak, Russell Greiner, and Brendan Frey. "Training restricted boltzmann machine by perturbation." arXiv preprint arXiv:1405.1436 (2014). (Year: 2014).*

Zhao, Zhi-jin, and Jia-wei Gu. "Recognition of digital modulation signals based on hybrid three-order restricted Boltzmann machine." 2015 IEEE 16th International Conference on Communication Technology (ICCT). IEEE, 2015: 166-169 (Year: 2015).*

C. R. Schneider et al., "Analog CMOS Deterministic Boltzmann Circuits", IEEE Journal of Solid-State Circuits, vol. 28, No. 8, Aug. 1993, pp. 907-914 (8 pages).

R. Babbush et al., "Resource Efficient Gadgets for Compiling Adiabatic Quantum Optimization Problems", arXiv:1307.8041v1, [quant-ph], Jul. 31, 2013 (11 pages).

V. S. Denchev et al., "What is the Computational Value of Finite Range Tunneling?", arXiv:1512.02206v4, [quant-ph], Jan. 26, 2016 (17 pages).

A. DeGloria et al., "Efficient Implementation of the Boltzmann Machine Algorithm", IEEE Transactions on Neural Networks, vol. 4, No. 1, Jan. 1993, pp. 159-163 (5 pages).

* cited by examiner

INFORMATION PROCESSING APPARATUS, ISING DEVICE, AND INFORMATION PROCESSING APPARATUS CONTROL METHOD

CROSS-REFERENCE TO RELATED APPLICATION

This application is based upon and claims the benefit of priority of the prior Japanese Patent Application No. 2016-120717, filed on Jun. 17, 2016, the entire contents of which are incorporated herein by reference.

FIELD

The embodiments discussed herein relate to an information processing apparatus, an ising device, and an information processing apparatus control method.

BACKGROUND

Neumann computers are not very suitable for solving multivariable optimization problems. However, to solve these problems, there is a method which uses an ising device (also referred to as a Boltzmann machine) that uses an ising energy function. Such an ising device performs calculation by replacing a problem to be calculated with an ising model, which is a model representing the behavior of a ferromagnetic spin.

An ising device can be modeled by using a neural network. In such cases, each of the units (bits) included in the ising device functions as a neuron that outputs 0 or 1 on the basis of states of the other bits and weight values (also referred to as coupling coefficients) each of which indicates coupling strength between the corresponding bit and one of the other bits. For example, the ising device performs simulated annealing to obtain, as a solution, a combination of bit states from which a minimum value of the above energy function (also referred to as a cost function, an objective function, etc.) is obtained.

To shorten the calculation time, realizing such an ising device with hardware modules has conventionally been proposed.

A conventional ising device uses an energy function (which will hereinafter be referred to as a second-order energy function) including a weight value of coupling strength between two bits. One possible way to apply an ising device to more variety of optimization problems is to use an energy function (which will hereinafter be referred to as a high-order energy function) including weight values indicating mutual coupling strength among three or more bits.

There has been proposed a method for solving an optimization problem using a high-order energy function. In this method, an optimization problem using a high-order energy function is solved by converting the optimization problem into an optimization problem using a plurality of second-order energy functions.

Japanese Laid-open Patent Publication No. 07-200512, Aug. 4, 2015

C. R. Schneider and H. C. Card, "Analog CMOS Deterministic Boltzmann Circuits", IEEE Journal of Solid-State Circuits, VOL. 28, No. 8, pp. 907-914, August 1993

R. Babbush, B. O'Gorman, and A. Aspuru-Guzik, "Resource Efficient Gadgets for Compiling Adiabatic Quantum Optimization Problems", arXiv: 1307.8041v1, [quant-ph], Jul. 31, 2013

V. S. Denchev, S. Boixo, S. V. Isakov, N. Ding, R. Babbush, V. Smelyanskiy, J. Martinis, and H. Neven, "What is the Computational Value of Finite Range Tunneling?", arXiv: 1512.02206v4, [quant-ph], Jan. 26, 2016

However, when converting an optimization problem using a high-order energy function into an optimization problem using second-order energy functions, "ancillary bit" has conventionally been introduced. Addition of this ancillary bit could slow down the convergence into an optimal solution or decrease the number of usable bits in simulated annealing.

SUMMARY

According to one aspect, there is provided an information processing apparatus including: an ising device; and a control device, wherein the ising device includes: a random signal generation circuit that outputs, a plurality of times, a selection signal for randomly selecting a first neuron whose output value is allowed to be updated from n neurons, wherein n is a natural number of 3 or more, d−1 arithmetic circuits that calculate, based on a plurality of weight values indicating strength of 2-body coupling to d-body coupling of two to d neurons including the first neuron selected from the n neurons based on the selection signal and n-bit output values of the n neurons, d−1 energy values indicating energies generated by the respective 2-body to d-body coupling or change amounts of the d−1 energy values, wherein d is a natural number not less than 3 and not more than n, an adder circuit that calculates a first sum by adding up the d−1 energy values or calculates a second sum by adding up the change amounts of the d−1 energy values and outputs the first sum or the second sum, a comparator circuit that determines and outputs a first output value of the first neuron, based on a first comparison result obtained by comparing a first value based on a sum of the first sum and a noise value with a threshold or based on a second comparison result obtained by comparing a third value with the threshold, the third value being based on a sum of a second value that indicates a sum of the energies generated by the respective 2-body to d-body coupling and that is updated based on the second sum and the noise value, an update circuit that outputs n-bit updated output values in which one bit has been updated based on the selection signal and the first output value, and a holding circuit that holds the n-bit updated output values and outputs the n-bit updated output values as the n-bit output values used by the arithmetic circuits, and wherein the control device controls a noise width of the noise value.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
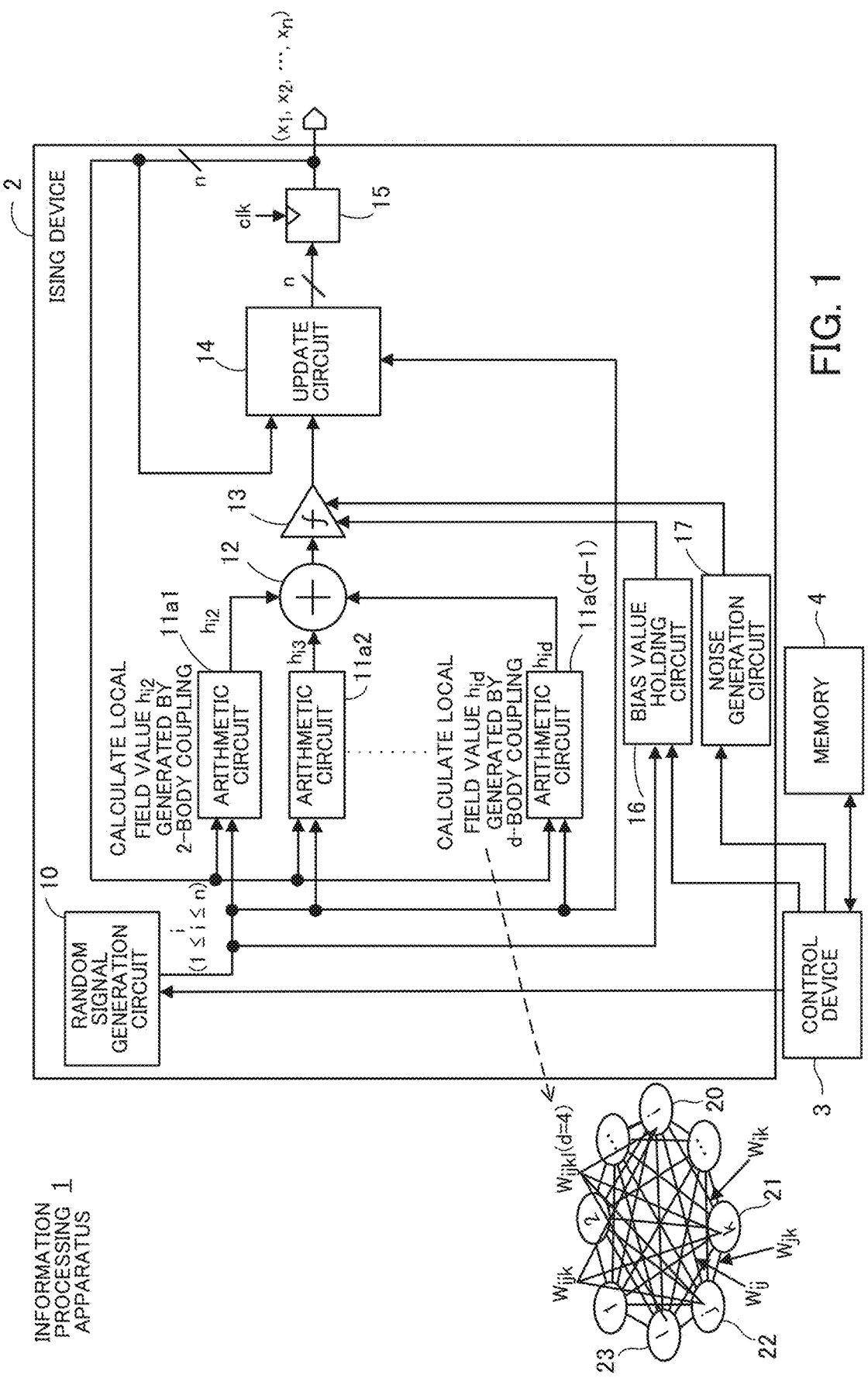
FIG. 1 illustrates an example of an information processing apparatus according to a first embodiment.

Hereinafter, embodiments will be described with reference to the accompanying drawings, wherein like reference characters refer to like elements throughout.

First Embodiment

FIG. 1 illustrates an example of an information processing apparatus 1 according to a first embodiment.

The information processing apparatus 1 includes an ising device 2, a control device 3, and a memory 4. The control device 3 maps an optimization problem using a high-order (d≥3) energy function in the ising device 2. In addition, the ising device 2 according to the first embodiment functions as a neural network including n neurons (n is a natural number of 3 or more).

The ising device 2 includes a random signal generation circuit 10, arithmetic circuits 11a1 to 11a(d−1), an adder circuit 12, a comparator circuit 13, an update circuit 14, a holding circuit 15, a bias value holding circuit 16, and a noise generation circuit 17. For example, the ising device 2 is realized by a single semiconductor integrated circuit (a single chip).

The random signal generation circuit 10 outputs a selection signal for randomly selecting a neuron whose output value is allowed to be updated from the n neurons a plurality of times. For example, each of the n neurons is given a different identification number (which will hereinafter be referred to as a neuron ID). In FIG. 1, the random signal generation circuit 10 outputs a selection signal that specifies i (1≤i≤n) as a neuron ID. For example, the random signal generation circuit 10 includes linear feedback shift registers (LFSRs).

The d−1 arithmetic circuits 11a1 to 11a(d−1) (d is a natural number not less than 3 and not more than n) receive the selection signal outputted by the random signal generation circuit 10 and n-bit output values $x_1$ to $x_n$ of the n neurons outputted by the holding circuit 15. In addition, the arithmetic circuit 11a1 to 11a(d−1) calculate d−1 energy values $h_{i2}$ to $h_{id}$ on the basis of a plurality of weight values indicating strength of 2-body coupling to d-body coupling of two to d neurons including the neuron selected by the selection signal and the output values $x_1$ to $x_n$. The energy values will hereinafter be referred to as local field values. The local field values $h_{i2}$ to $h_{id}$ indicate energies generated by the respective 2-body coupling to d-body coupling.

For example, the control device 3 sets these weight values indicating strength of 2-body coupling to d-body coupling (which will simply be referred to as weight values indicating 2-body coupling to d-body coupling) on the basis of the problem to be calculated and stores the weight values in storage units (for example, registers) in the arithmetic circuit 11a1 to 11a(d−1). FIG. 1 illustrates examples of weight values indicating 2-body coupling, 3-body coupling, and 4-body coupling when n=1 neurons. For example, the weight value of 2-body coupling of neurons 20 and 21 whose neuron IDs are i and k, respectively, is denoted by $W_{ik}$. In addition, the weight value of 2-body coupling of the neuron 21 and a neuron 22 whose neuron IDs are k and j, respectively, is denoted by $W_{jk}$. In addition, the weight value of 2-body coupling of the neurons 20 and 22 whose neuron IDs are i and j, respectively, is denoted by $W_{ij}$. In addition, the weight value of 3-body coupling of the neurons 20 to 22 whose neuron IDs are i, j, and k, respectively, is denoted by $W_{ijk}$. In addition, the weight value of 4-body coupling of the neurons 20 to 22 and a neuron 23 whose neuron IDs are j, k, and l, respectively, is denoted by $W_{ijkl}$.

The adder circuit 12 adds up the local field values $h_{i2}$ to $h_{id}$ and outputs a sum of these values.

The comparator circuit 13 adds up the sum obtained by the adder circuit 12, a noise value, and a bias value and compares a sum of these values with a threshold (for example, 0). On the basis of the comparison result, the comparator circuit 13 determines and outputs the output value of the neuron selected by the selection signal. For example, the comparator circuit 13 includes an adder circuit that adds up the sum obtained by the adder circuit 12, the noise value, and the bias value. Hereinafter, a value (energy value) obtained by adding up the sum obtained by the adder circuit 12 and the bias value will be referred to as a local field value $h_i$.

For example, when the sum of the local field value $h_i$ and the noise value is negative, the comparator circuit 13 outputs 1. When the sum of the local field value $h_i$ and the noise value is positive, the comparator circuit 13 outputs 0. The bias value may be 0.

The update circuit 14 outputs n-bit updated output values of the n neurons in which one bit has been updated on the basis of the selection signal and the output value outputted by the comparator circuit 13. For example, when the output value of a neuron whose neuron ID is i outputted by the comparator circuit 13 is different from the previous value, the update circuit 14 outputs n-bit updated output values in which the i-th bit has been updated. When the output value of the neuron whose neuron ID is i outputted by the comparator circuit 13 is the same as the previous value, the update circuit 14 may output no updated output values.

The holding circuit 15 holds the updated output values outputted by the update circuit 14 and outputs the updated output values as the n-bit output values of the n neurons used by the arithmetic circuits 11a1 to 11a(d−1) in synchronization with a clock signal clk. The holding circuit 15 is realized by a plurality of flip flops, for example. The clock signal clk is supplied by the control device 3, for example. The clock signal clk may be supplied by a clock signal generation circuit (not illustrated) arranged outside or inside the ising device 2.

For example, the bias value holding circuit 16 is a register or a flash memory and holds a bias value for each of the n neurons. In addition, the bias value holding circuit 16 supplies the bias value of a neuron specified by the selection signal outputted by the random signal generation circuit 10 to the comparator circuit 13, for example. For example, the control device 3 sets the bias values in advance on the basis of the problem to be calculated.

The noise generation circuit 17 outputs a noise value for performing simulated annealing on the basis of an instruction from the control device 3. For example, as is the case with the random signal generation circuit 10, the noise generation circuit 17 may also be configured by using LFSRs. In addition, for example, the noise generation circuit 17 includes an amplifier circuit. For example, the control device 3 changes the amplification factor of the amplifier circuit, to control the amplitude of the noise value.

The control device 3 controls the random signal generation circuit 10 and the noise generation circuit 17 to control the noise width. For example, to perform simulated annealing, the control device 3 controls the amplifier circuit included in the noise generation circuit 17 and gradually drops the noise width of the noise value (the amplitude of the noise). In addition, the control device 3 previously sets a plurality of weight values and a plurality of bias values on the basis of the optimization problem to be calculated. In addition, the control device 3 performs mapping by writing the plurality of weight values in registers in the arithmetic circuits 11a1 to 11a(d−1) via buses (not illustrated) and writing the plurality of bias values in the bias value holding circuit 16.

For example, the control device 3 may be realized by a processor. Examples of the processor include a central processing unit (CPU), a micro processing unit (MPU), a digital signal processor (DSP), an application specific integrated circuit (ASIC), and a programmable logic device (PLD). The processor may be a combination of at least two of a CPU, an MPU, a DSP, an ASIC, and a PLD. The control device 3 may be a personal computer (PC), a server computer, or the like.

For example, when the control device 3 is a processor, the memory 4 is a non-volatile storage device that holds an operating system (OS), middleware, software programs such as application software programs, and data executed by the processor. The memory 4 may hold a program for generating weight value lists, which will be described below. Examples of the non-volatile storage device include a flash memory, a solid state drive (SSD), and a hard disk drive (HDD).

The above information processing apparatus 1 realizes operations of the ising energy function by using hardware modules. For example, a high-order energy function E(x) is defined by the following expression (1).

$$E(x) = -\sum_{\langle i,j \rangle} W_{ij} x_i x_j - \sum_i b_i x_i - \sum_{\langle i,j,k \rangle} W_{ijk} x_i x_j x_k - \sum_{\langle i,j,k,l \rangle} W_{ijkl} x_i x_j x_k x_l \ldots \quad (1)$$

The first term on the right side of expression (1) is directed to all the combinations of two neurons selectable from all the neurons without missing any neuron or redundantly counting any neuron. More specifically, the first term represents the sum of products, each of which is obtained by multiplying the output values of two neurons and a weight value of the corresponding 2-body coupling by each other. The second term on the right side of expression (1) represents the sum of products, each of which is obtained by multiplying the bias value by the output value per neuron. In expression (1), $b_i$ represents the bias value of the neuron whose neuron ID is i. The third term on the right side of expression (1) is directed to all the combinations of three neurons selectable from all the neurons without missing any neuron or redundantly counting any neuron. More specifically, the third term represents the sum of products, each of which is obtained by multiplying the output values of three neurons and a weight value of the corresponding 3-body coupling by each other. The fourth term on the right side of expression (1) is directed to all the combinations of four neurons selectable from all the neurons without missing any neuron or redundantly counting any neuron. More specifically, the fourth term represents the sum of products, each of which is obtained by multiplying the output values of four neurons and a weight value of the corresponding 4-body coupling by each other.

In this ising energy function, the change of the energy value when the output value of a neuron changes from 1 to 0 or from 0 to 1 is determined by the weight values, each of which indicates coupling between the neuron and one of the other neurons, and the output values of the neurons.

For example, when the output value of a neuron whose neuron ID is i has changed, the change of the energy is expressed by the following expression (2).

$$\Delta E_i = (2x_i - 1) \cdot \left( \sum_j W_{ij} x_j + b_i + \sum_{\langle j,k \rangle} W_{ijk} x_j x_k + \sum_{\langle j,k,l \rangle} W_{ijkl} x_j x_k x_l \ldots \right) \quad (2)$$

In expression (2), when $x_i$ is 1, $2x_i-1$ is 1, and when $x_i$ is 0, $2x_i-1$ is −1. In addition, the local field value $h_i$ that indicates the energy generated by coupling of neurons including the neuron whose neuron ID is i in expression (2) may be expressed by the following expression (3).

$$h_i = b_i + \sum_j W_{ij} x_j + \sum_{\langle j,k \rangle} W_{ijk} x_j x_k + \sum_{\langle j,k,l \rangle} W_{ijkl} x_j x_k x_l + \ldots \quad (3)$$

The second term on the right side of expression (3) represents the energy generated by 2-body coupling of neurons including the neuron whose neuron ID is i. The third term on the right side represents the energy generated by 3-body coupling of neurons including the neuron whose neuron ID is i. $W_{ijk}$ is a weight value of 3-body coupling of neurons whose neuron IDs are i, j, and k, respectively, of all the n neurons. In addition, the fourth term on the right side represents the energy generated by 4-body coupling of neurons including the neuron whose neuron ID is i. $W_{ijkl}$ is a weight value of 4-body coupling of neurons whose neuron IDs are i, j, k, and l, respectively, of all the n neurons.

As is clear from expressions (2) and (3), when the local field value $h_i$ is negative and $2x_i-1$ is positive or when the local field value $h_i$ is positive and $2x_i-1$ is negative, $\Delta E_i$ is negative, i.e., the energy drops.

The arithmetic circuits $11a1$ to $11a(d-1)$ illustrated in FIG. 1 calculate the local field value $h_{i2}$ to $h_{id}$ that indicate the energies generated by the respective 2-body coupling to d-body coupling.

For example, the arithmetic circuit $11a1$ calculates the local field value $h_{i2}$ corresponding to the second term on the right side of expression (3), and the arithmetic circuit $11a2$ calculates the local field value $h_{i3}$ corresponding to the third term of expression (3).

(Example of Arithmetic Circuit)

Figure 2:
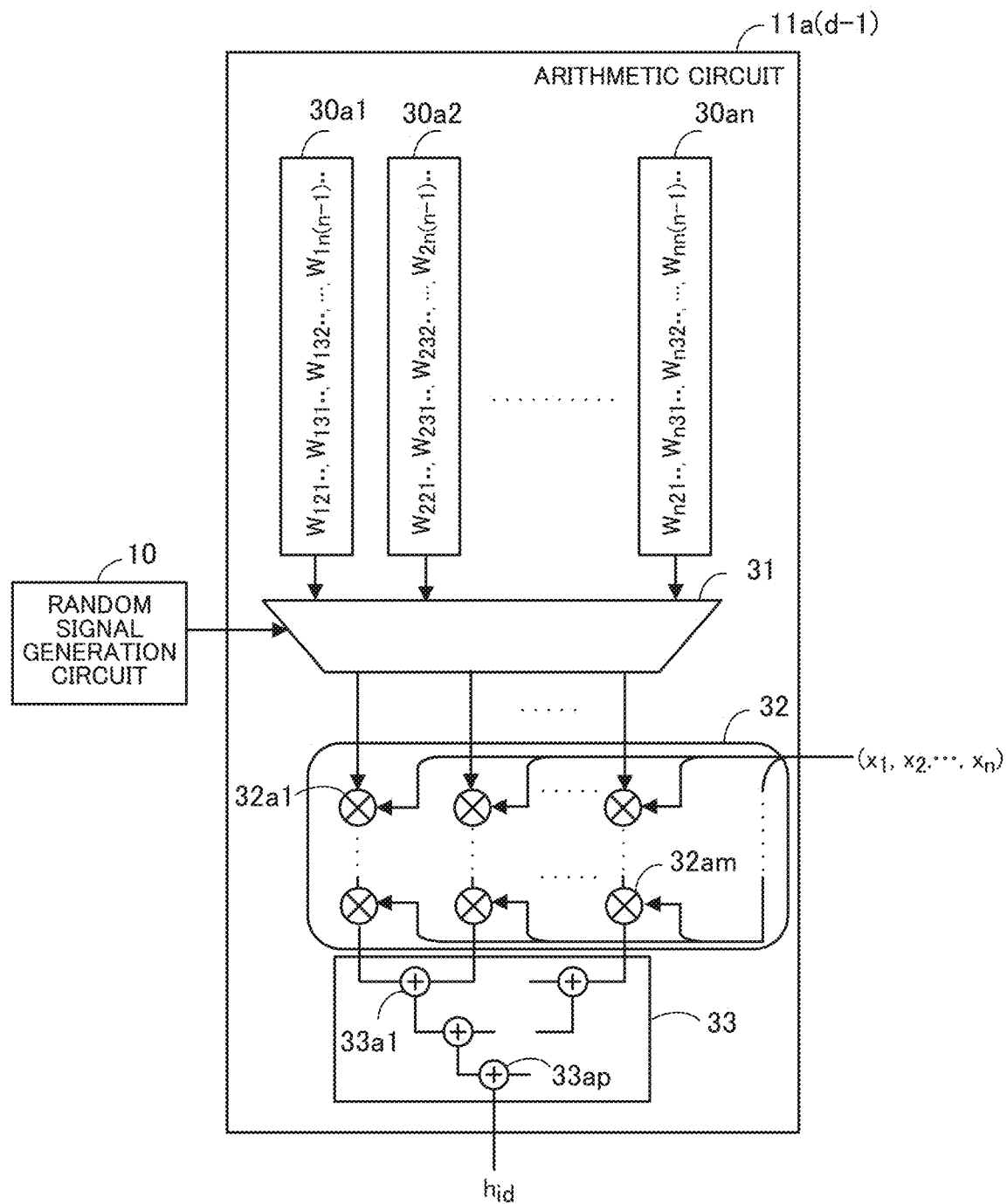
FIG. 2 illustrates an example of an arithmetic circuit that calculates a local field value generated by d-body coupling.

FIG. 2 illustrates an example of an arithmetic circuit that calculates a local field value generated by d-body coupling.

The arithmetic circuit $11a(d-1)$ includes registers $30a1$ to $30an$, a selector circuit 31, a multiplier unit 32, and an adder unit 33.

The registers $30a1$ to $30an$ hold a plurality of weight values of d-body coupling of d neurons. For example, the register $30a1$ holds a plurality of weight values of d-body coupling of the d neurons including a neuron whose neuron ID is 1. The register $30a2$ holds a plurality of weight values of d-body coupling of the d neurons including a neuron whose neuron ID is 2. In addition, the register $30an$ holds a plurality of weight values of d-body coupling of the d neurons including a neuron whose neuron ID is n.

The selector circuit 31 outputs a plurality of weight values stored in one of the registers $30a1$ to $30an$ on the basis of the selection signal outputted by the random signal generation circuit 10. For example, when the selector circuit 31 receives a selection signal that specifies the neuron whose neuron ID is 1, the selector circuit 31 outputs a plurality of weight values stored in the register $30a1$.

The multiplier unit 32 and the adder unit 33 calculate the energy (the local field value $h_{id}$) generated by d-body coupling, the energy being a part of the local field value $h_i$ expressed by the expression (3), on the basis of the output values $x_1$ to $x_n$ and the plurality of weight values outputted by the selector circuit 31. The multiplier unit 32 includes m multiplier circuits $32a1$ to $32am$, and the adder unit 33 includes p adder circuits $33a1$ to $33ap$. The number of multiplier circuits $32a1$ to $32am$ and the number of adder circuits $33a1$ to $33ap$ will be described below.

(Example of Update Circuit and Holding Circuit)

Figure 3:
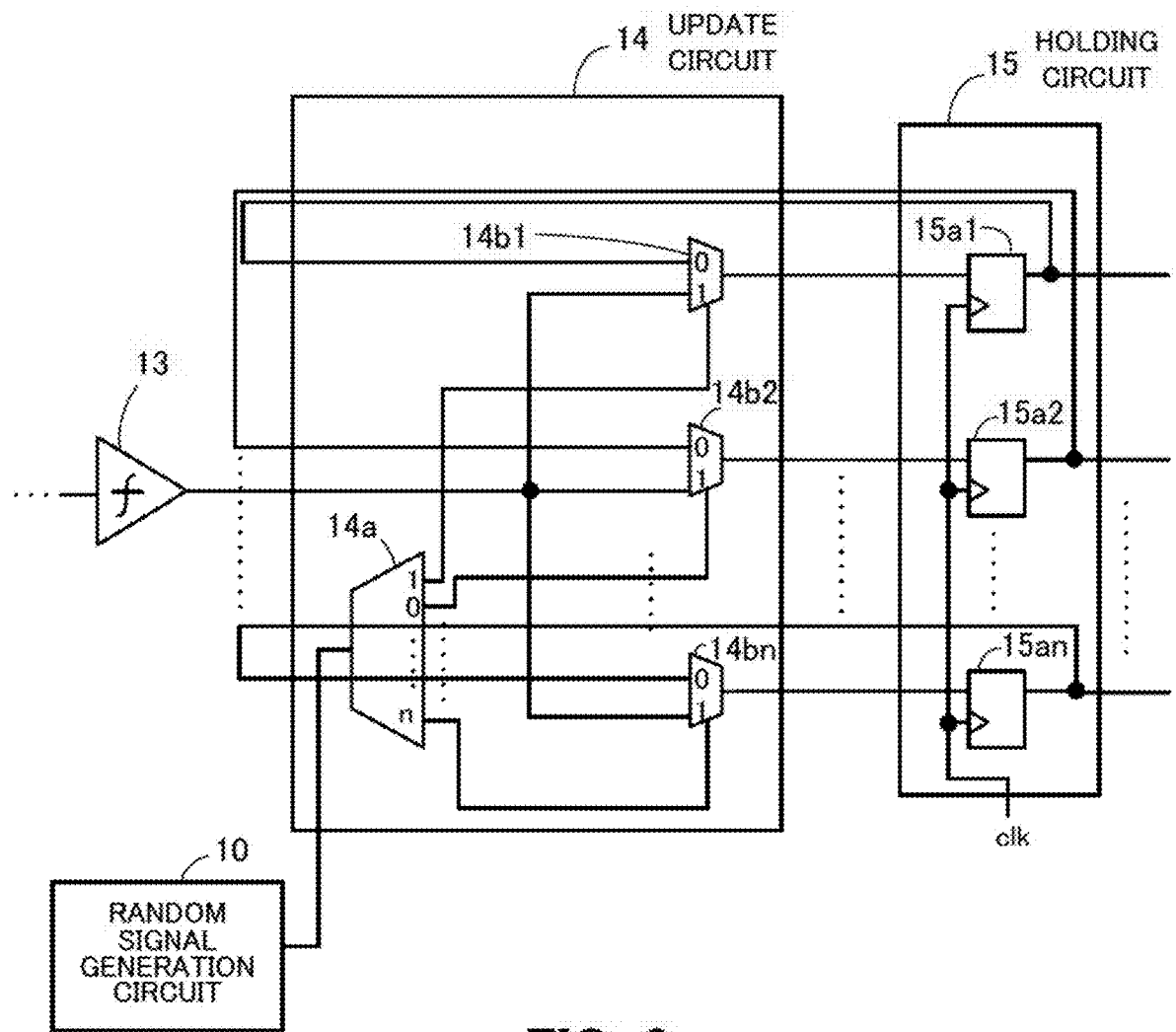
FIG. 3 illustrates examples of an update circuit and a holding circuit.

FIG. 3 illustrates examples of the update circuit 14 and the holding circuit 15.

The update circuit 14 includes a multiplexer $14a$ and selector circuits $14b1$ to $14bn$. The holding circuit 15 includes flip flops $15a1$ to $15an$.

The multiplexer $14a$ generates a selection signal supplied to the selector circuit $14b1$ to $14bn$ on the basis of the selection signal outputted by the random signal generation circuit 10. For example, when the multiplexer $14a$ receives a selection signal for selecting one of the n neurons, the multiplexer $14a$ supplies 1 as a selection signal to one of the selector circuits $14b1$ to $14bn$ that corresponds to the selected neuron. The multiplexer $14a$ supplies 0 to the other selector circuits. For example, when the multiplexer $14a$ receives a selection signal that specifies the neuron whose neuron ID is 1, the multiplexer $14a$ supplies 1 as the selection signal to the selector circuit $14b1$ and supplies 0 as the selection signal to the selector circuits $14b2$ to $14bn$.

The n selector circuits $14b1$ to $14bn$ are arranged to correspond to the n neurons. Each of the selector circuits $14b1$ to $14bn$ has two input terminals. One of the input terminals of a selector circuit is connected to the output terminal of a corresponding one of the flip flops $15a1$ to $15an$, and the other input terminal is connected to the output terminal of the comparator circuit 13. When any one of the selector circuits $14b1$ to $14bn$ receives 1 as the selection signal from the multiplexer $14a$, this selector circuit selects and outputs the output value of the neuron outputted by the comparator circuit 13. When any one of the selector circuits $14b1$ to $14bn$ receives 0 as the selection signal from the multiplexer $14a$, this selector circuit selects and outputs a value outputted by the corresponding one of the flip flops $15a1$ to $15an$.

The flip flops $15a1$ to $15an$ in the holding circuit 15 captures and outputs the values (n-bit updated output values) outputted by the selector circuits $14b1$ to $14bn$ in synchronization with the clock signal clk.

For example, when the random signal generation circuit 10 outputs a selection signal that specifies the neuron whose neuron ID is 1, the selector circuit $14b1$ selects and outputs the output value of the neuron outputted by the comparator circuit 13. The selector circuits $14b2$ to $14bn$ select and output the values outputted by the respective flip flops $15a2$ to $15an$. In this way, the holding circuit 15 outputs n-bit output values in which only the bit value corresponding to the neuron whose neuron ID is 1 has been updated.

(Example of Ising Device in which Optimization Problem Using Third-Order Energy Function is Mapped)

Figure 4:
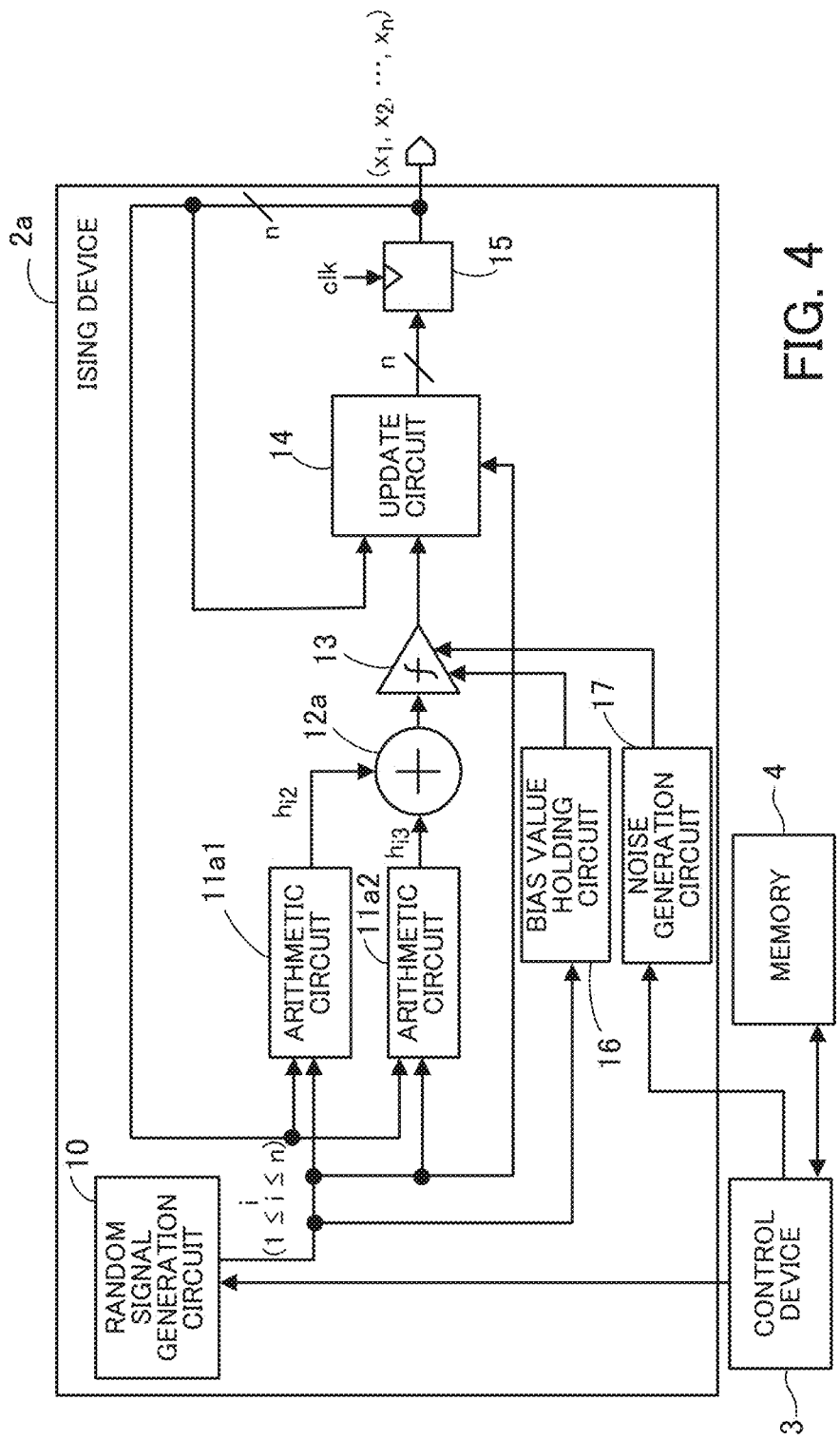
FIG. 4 illustrates an example of an ising device in which an optimization problem using a third-order energy function is mapped.

FIG. 4 illustrates an example of an ising device $2a$ in which an optimization problem using a third-order energy function is mapped. In FIGS. 1 and 4, like reference characters refer to like elements.

The ising device $2a$ in which an optimization problem using a third-order energy function is mapped includes the two arithmetic circuits $11a1$ and $11a2$. The arithmetic circuit $11a1$ calculates the local field value $h_{i2}$, which is the energy generated by 2-body coupling of two neurons including the neuron whose neuron ID is i. The arithmetic circuit $11a2$ calculates the local field value $h_{i3}$, which is the energy generated by 3-body coupling of three neurons including the neuron whose neuron ID is i.

An adder circuit $12a$ outputs a sum of the two local field values $h_{i2}$ and $h_{i3}$.

Figure 5:
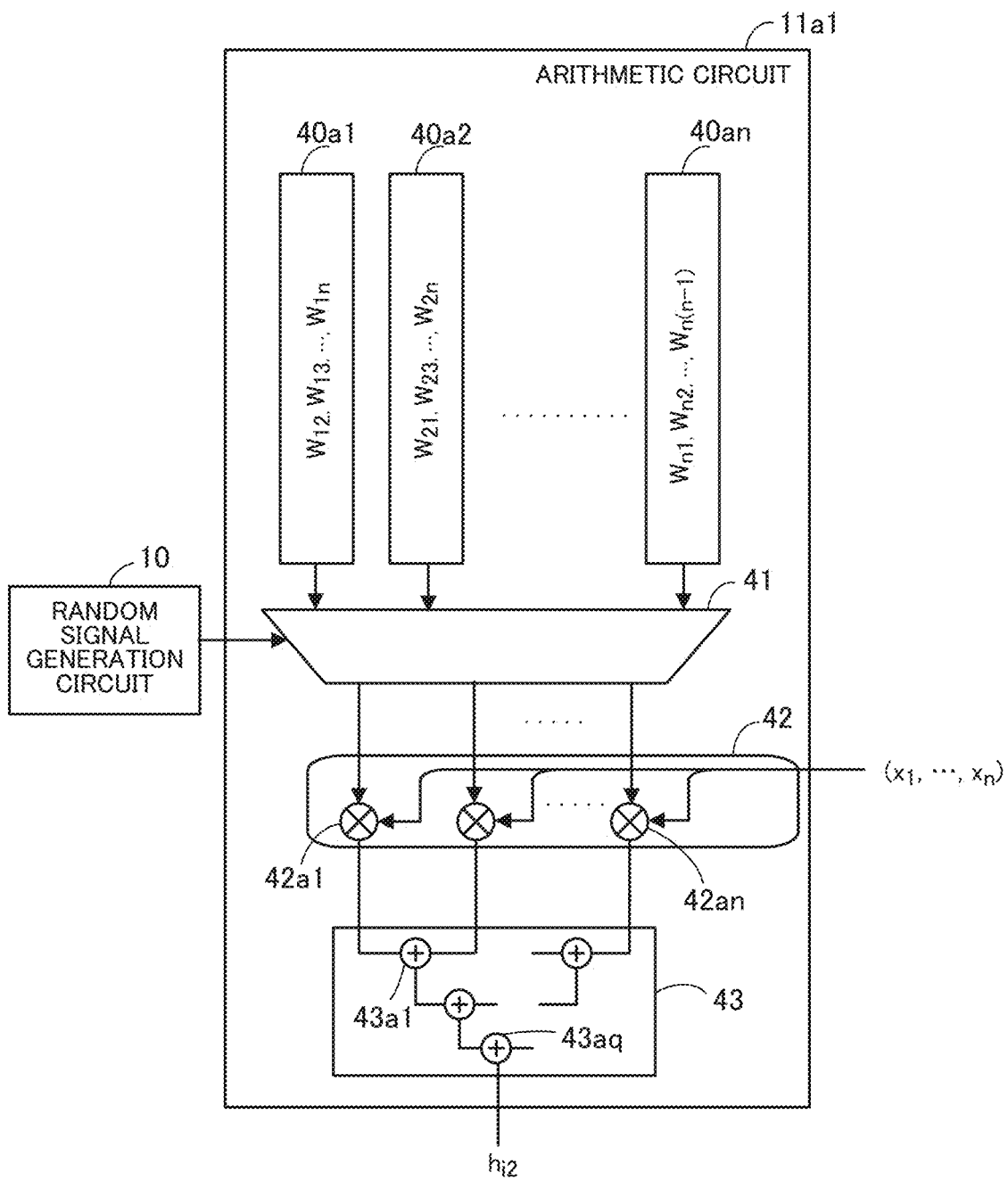
FIG. 5 illustrates an example of an arithmetic circuit that calculates a local field value generated by 2-body coupling.

FIG. 5 illustrates an example of the arithmetic circuit $11a1$ that calculates a local field value generated by 2-body coupling.

The arithmetic circuit $11a1$ includes registers $40a1$ to $40an$, a selector circuit 41, a multiplier unit 42, and an adder unit 43.

The registers $40a1$ to $40an$ hold a plurality of weight values, each of which indicates 2-body coupling of two neurons. For example, the register $40a1$ holds weight values $W_{12}$ to $W_{1n}$, each of which indicates 2-body coupling of two neurons including the neuron whose neuron ID is 1. The register $40a2$ holds a plurality of weight values $W_{21}$ and $W_{23\ to}\ W_{2n}$, each of which indicates 2-body coupling of two neurons including the neuron whose neuron ID is 2. In addition, the register $40an$ holds weight values $W_{n1}$ to $W_{n(n-1)}$, each of which indicates 2-body coupling of two neurons including a neuron whose neuron ID is n.

The selector circuit 41 outputs a plurality of weight values stored in one of the registers $40a1$ to $40an$ on the basis of the selection signal outputted by the random signal generation circuit 10.

The multiplier unit 42 includes n multiplier circuits 42a1 to 42an, and the adder unit 43 includes q adder circuits 43a1 to 43aq. The multiplier unit 42 and the adder unit 43 calculate the energy (the local field value $h_{i2}$) generated by 2-body coupling, the energy being a part of the local field value $h_i$ expressed by the expression (3), on the basis of the output values $x_1$ to $x_n$ and the plurality of weight values outputted by the selector circuit 41.

Figure 6:
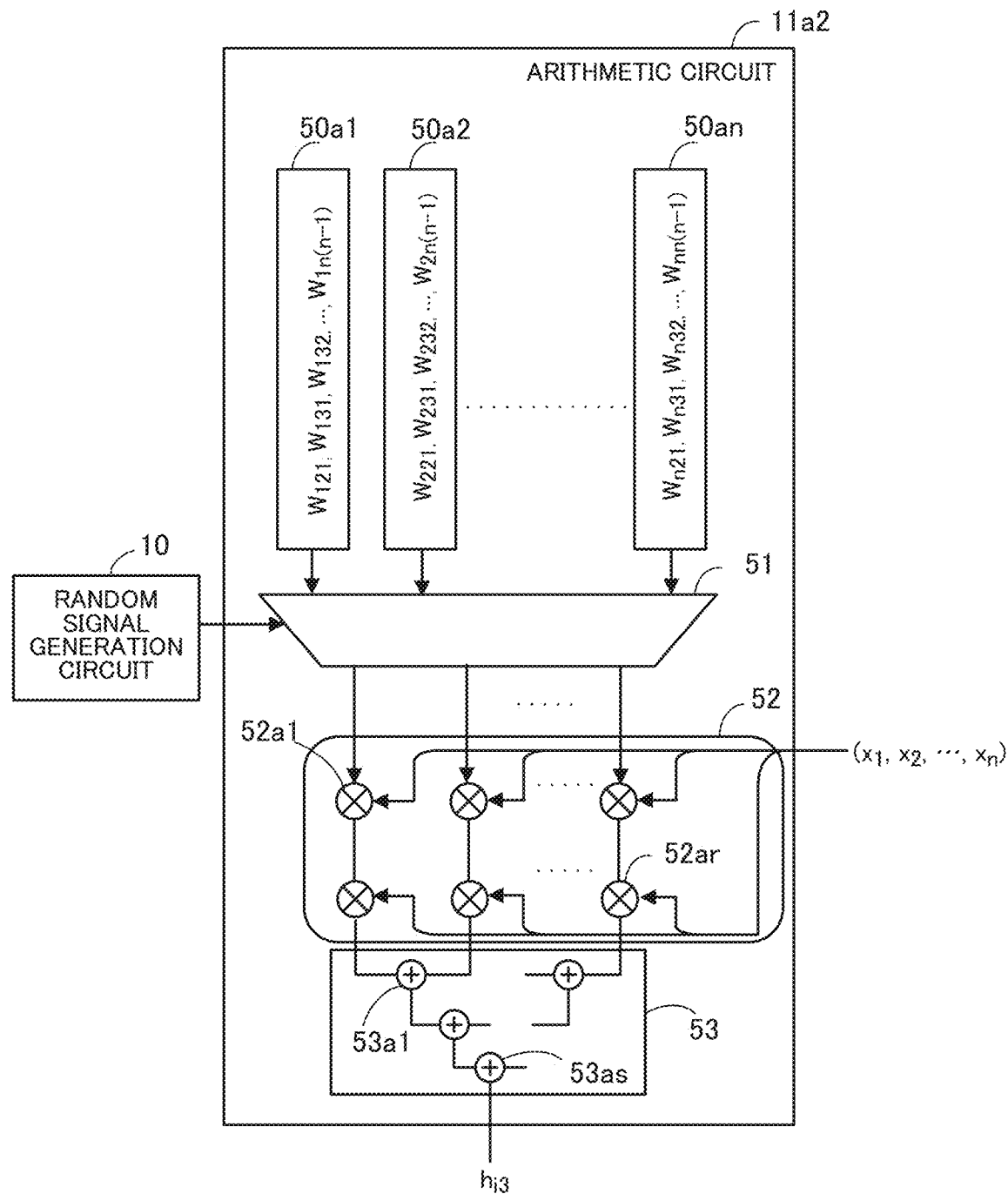
FIG. 6 illustrates an example of an arithmetic circuit that calculates a local field value generated by 3-body coupling.

FIG. 6 illustrates an example of the arithmetic circuit 11a2 that calculates a local field value generated by 3-body coupling.

The arithmetic circuit 11a2 includes registers 50a1 to 50an, a selector circuit 51, a multiplier unit 52, and an adder unit 53.

The register 50a1 to 50an hold a plurality of weight values, each of which indicates 3-body coupling of three neurons. For example, the register 50a1 holds weight values $W_{121}$, $W_{131}$, $W_{132}$, ..., and $W_{1n(n-1)}$, each of which indicates 3-body coupling of three neurons including the neuron whose neuron ID is 1. The register 50a2 holds a plurality of weight values $W_{221}$, $W_{231}$, $W_{232}$, ..., and $W_{2n(n-1)}$, each of which indicates 3-body coupling of three neurons including the neuron whose neuron ID is 2. In addition, the register 50an holds weight values $W_{n21}$, $W_{n31}$, $W_{n32}$, ..., and $W_{nn(n-1)}$, each of which indicates 3-body coupling of three neurons including the neuron whose neuron ID is n.

The selector circuit 51 outputs a plurality of weight values stored in one of the registers 50a1 to 50an on the basis of the selection signal outputted by the random signal generation circuit 10.

The multiplier unit 52 includes r multiplier circuits 52a1 to 52ar, and the adder unit 53 includes s adder circuits 53a1 to 53as. The multiplier unit 52 and the adder unit 53 calculate the energy (the local field value $h_{i3}$) generated by 3-body coupling, the energy being a part of the local field value $h_i$ expressed by the expression (3), on the basis of the output values $x_1$ to $x_n$ and the plurality of weight values outputted by the selector circuit 51.

(Example of Operation of Information Processing Apparatus According to First Embodiment)

Hereinafter, an example of an operation of the information processing apparatus 1 in FIG. 1 controlled by the control device 3 will be described with reference to a flowchart.

Figure 7:
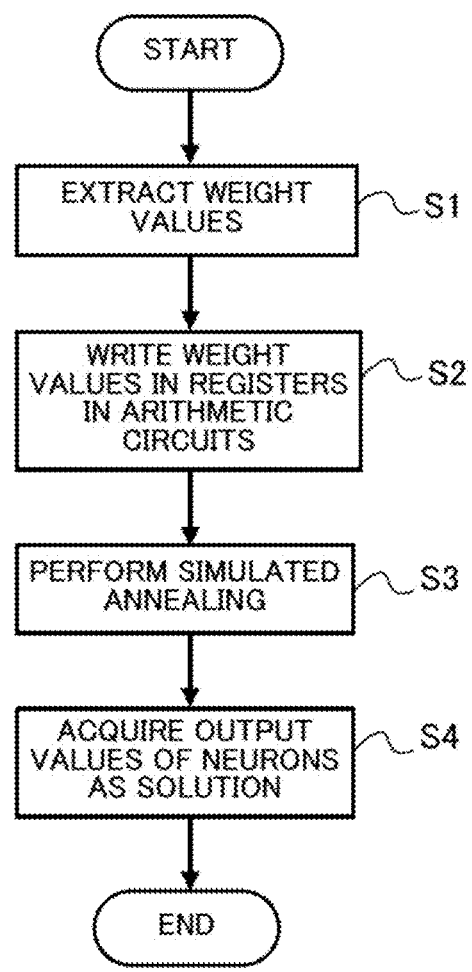
FIG. 7 is a flowchart illustrating an example of an operation of the information processing apparatus.

FIG. 7 is a flowchart illustrating an example of an operation of the information processing apparatus 1.

First, the control device 3 extracts the weight values of 2-body coupling to d-body coupling stored in the memory 4, for example (step S1). This example assumes that the weight values based on the problem to be calculated are prepared in advance.

Next, the control device 3 writes the extracted weight values in registers in arithmetic circuits 11a1 to 11a(d-1) (for example, in the registers 30a1 to 30an in the case of the arithmetic circuit 11a(d-1)) (step S2). Namely, in step S2, the optimization problem is mapped. In step S2, the control device 3 may write the bias value of an individual neuron in the bias value holding circuit 16.

Next, the simulated annealing is performed, which is controlled by the control device 3 (step S3). Next, the control device 3 acquires the output values $x_1$ to $x_n$ of the n neurons as a result of the simulated annealing. Namely, the control device 3 acquires the output values $x_1$ to $x_n$ as a solution to the optimization problem (step S4). Next, the control device 3 ends the present processing.

Figure 8:
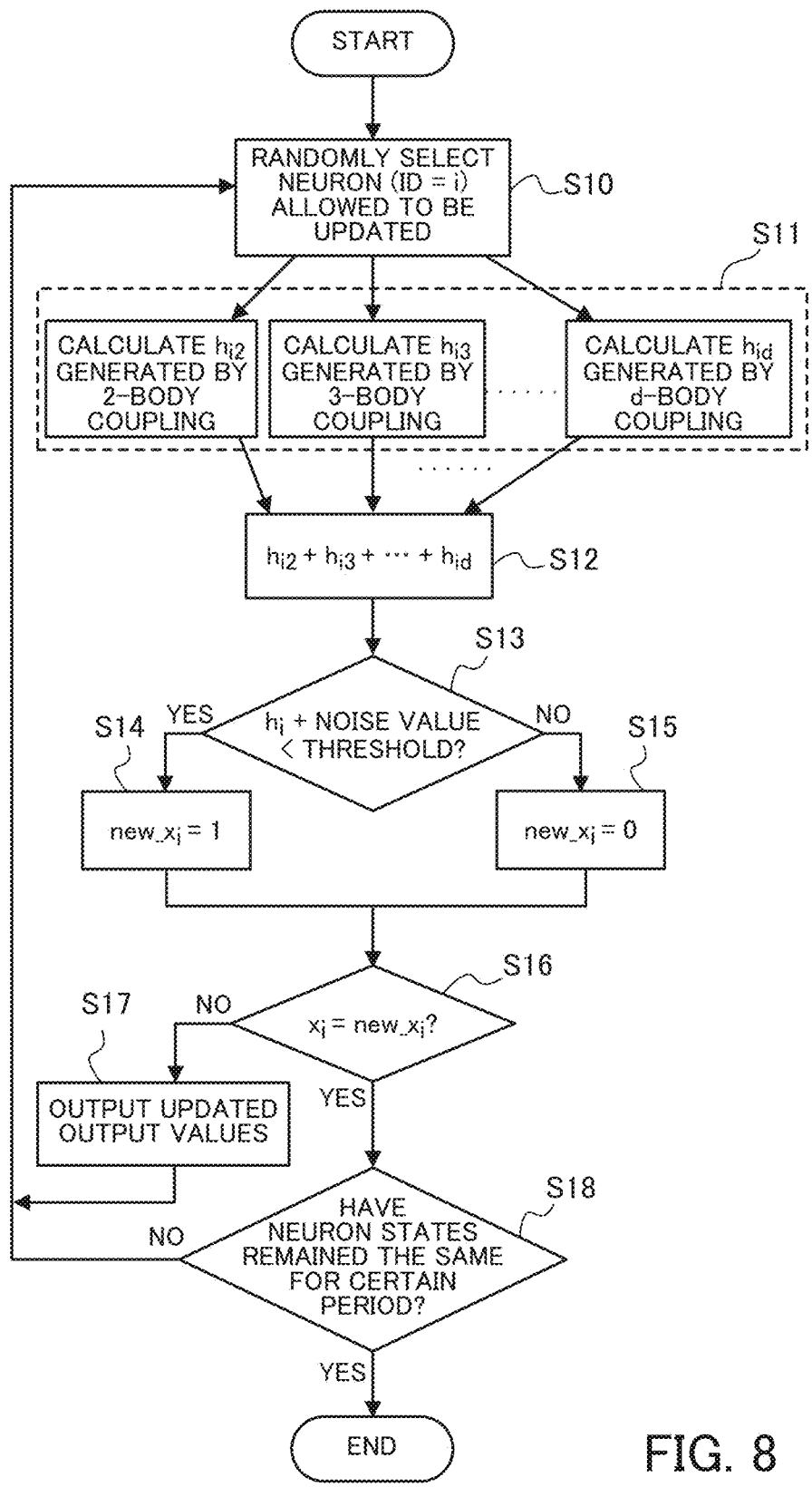
FIG. 8 is a flowchart illustrating an example of simulated annealing.

FIG. 8 is a flowchart illustrating an example of simulated annealing.

First, controlled by the control device 3, the random signal generation circuit 10 outputs a selection signal for randomly selecting a neuron whose output value is allowed to be updated (a neuron whose neuron ID is i) (step S10).

Next, the arithmetic circuit 11a1 to 11a(d-1) calculate the local field values $h_{i2}$ to $h_{id}$ that indicate the energies generated by 2-body coupling to d-body coupling, respectively (step S11). Next, the adder circuit calculates a sum of the local field values $h_{i2}$ to $h_{id}$ (step S12).

When a sum of the local field value $h_i$ (a sum of the sum calculated by the adder circuit 12 and a bias value) and a noise value is smaller than a threshold (for example, 0) (step S13: YES), the comparator circuit 13 outputs 1 as its output value (new_$x_i$) (step S14).

When a sum of the local field value $h_i$ and the noise value is equal to or more than the threshold (step S13: NO), the comparator circuit 13 outputs 0 as its output value (new_$x_i$) (step S15).

After steps S14 or S15, if the output value new_$x_i$ differs from the original output value $x_i$ of the neuron whose neuron ID is i (step S16: NO), the update circuit 14 outputs n-bit updated output values in which the i-th bit has been updated (step S17). Next, the processing returns to step S10.

If the output value new_$x_i$ is the same as the original output value $x_i$ (step S16: YES), the control device 3 determines whether the output values $x_1$ to $x_n$ (neuron states) have remained the same for a certain period (step S18). If the output values $x_1$ to $x_n$ have remained the same for a certain period (step S18: YES), the control device 3 ends the simulated annealing.

If the output values $x_1$ to $x_n$ have changed within the certain period (step S18: NO), the processing returns to step S10.

The simulated annealing is performed as the noise generation circuit 17 gradually drops the noise width under control of the control device 3 every time a neuron allowed to be updated is selected.

For example, the noise generation circuit 17 generates a noise value so that the probability with which the output value of the comparator circuit 13 represents 1 accords with a sigmoid function. For example, the noise generation circuit 17 generates a noise value so that a probability $P_i(h_i)$ with which the output value $x_i$ of the neuron whose neuron ID is i represents 1 satisfies the following expression (4).

$$P_i(h_i)=1/[1+\exp(-h_i/T)] \quad (4)$$

In expression (4), T represents an effective temperature.

A probability density function p(ns) of a noise value ns generated to obtain the probability $P_i(h_i)$ in expression (4) is expressed by the following expression (5).

$$p(ns)=\exp(-h_i/T)/[1+\exp(-h_i/T)]^2 \quad (5)$$

Figure 9:
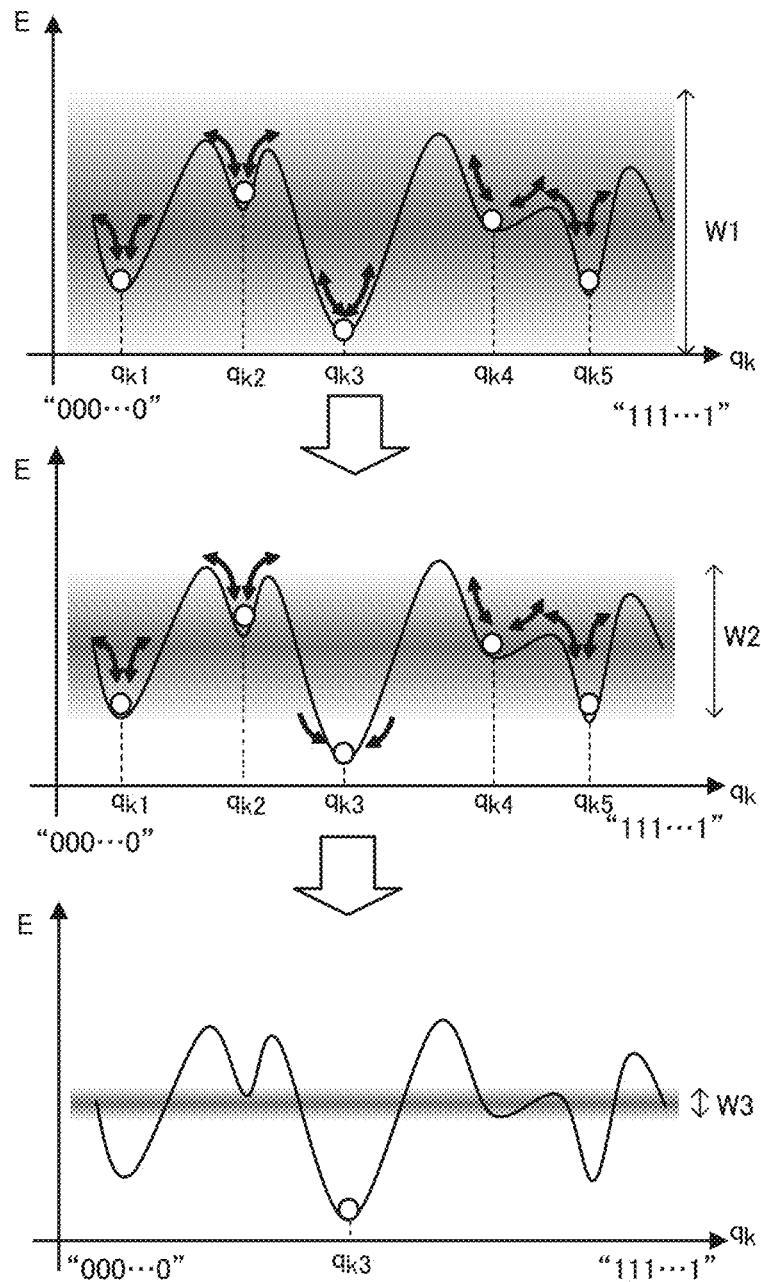
FIG. 9 illustrates progress of simulated annealing.

FIG. 9 illustrates progress of simulated annealing.

The vertical axis represents energy E, and the horizontal axis represents combinations $q_K$ of output values of all the neurons. The combinations $q_K$ are represented by "000 ... 0" to "111 ... 1". FIG. 9 illustrates how the convergence into a solution is achieved as the noise width is dropped from W1 to W3. Dropping the noise width means dropping the effective temperature T in expression (5).

When the noise width is W1, even when an individual solution reaches a local solution $q_{k1}$, $q_{k2}$, $q_{k4}$, or $q_{k5}$ (a solution when the energy represents a local minimal value), the local solution can change in the direction of higher energy. Thus, these solutions can shift from the local solutions. As the noise width gradually drops to W2 and W3, the change of the individual solution is gradually limited, and the convergence into an optimal solution $q_{k3}$ (a solution when the energy represents a minimum value) is finally achieved.

In the information processing apparatus 1 and the ising device 2 according to the first embodiment, the arithmetic circuits 11a1 to 11a(d−1) calculate the energies (the local field values $h_{i2}$ to $h_{id}$) generated by 2-body coupling to d-body coupling of 2 to d neurons, respectively. In addition, a value based on a sum of the local field values $h_{i2}$ to $h_{id}$ is compared with a threshold, and the output values of the neurons are determined on the basis of the comparison result.

In this way, an optimization problem using a high-order energy function is mapped in the ising device 2 without using any ancillary bit. While addition of this ancillary bit could slow down the convergence into an optimal solution or decrease the number of usable bits in simulated annealing, the ising device 2 does not have these problems.

In addition, for example, an optimization problem using a high-order energy function does not need to be converted into an optimization problem using a plurality of second-order energy functions, an optimization problem is easily mapped in the ising device 2.

Examples of such an optimization problem using a high-order energy function include a non-deterministic polynomial (NP) complete problem.

(Examples of Extraction and Writing of Weight Values)

Next, examples of steps S1 and S2 illustrated in FIG. 7 will be described.

Figure 10:
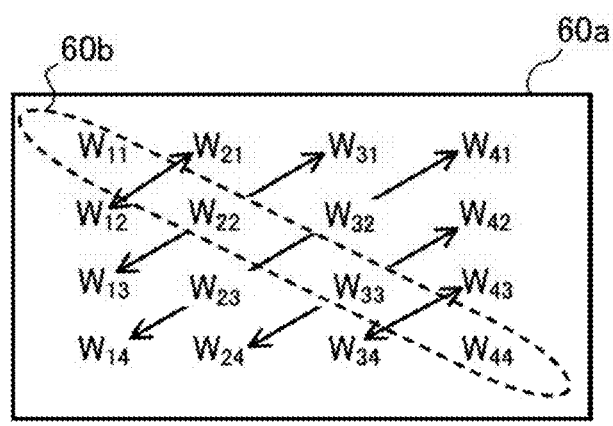
FIG. 10 illustrates examples of weight values indicating 2-body coupling.

FIG. 10 illustrates examples of weight values indicating 2-body coupling.

FIG. 10 illustrates a weight value group 60a including a plurality of weight values each of which indicates 2-body coupling when the number of neurons is 4. For example, $W_{21}$ is a weight value that indicates 2-body coupling of the two neurons whose neuron IDs are 2 and 1, respectively.

With the Boltzmann machine, there are conditions that $W_{ii}=0$ and $W_{ij}=W_{ji}$ (i and j are each a natural number not less than 1 and not more than n). Thus, $W_{21}=W_{12}$, $W_{31}=W_{13}$, $W_{41}=W_{14}$, $W_{42}=W_{24}$, and $W_{43}=W_{34}$. In addition, each of the weight values $W_{11}$, $W_{22}$, $W_{33}$, and $W_{44}$ in a weight value group 60b in FIG. 10 is 0.

Thus, calculation may be performed without the weight values $W_{11}$, $W_{22}$, $W_{33}$, and $W_{44}$. In contrast, both weight values having a symmetry relationship such as $W_{21}$ and $W_{12}$ are used to calculate the local field value $h_{i2}$ generated by 2-body coupling, as illustrated in FIG. 5.

Figure 11:
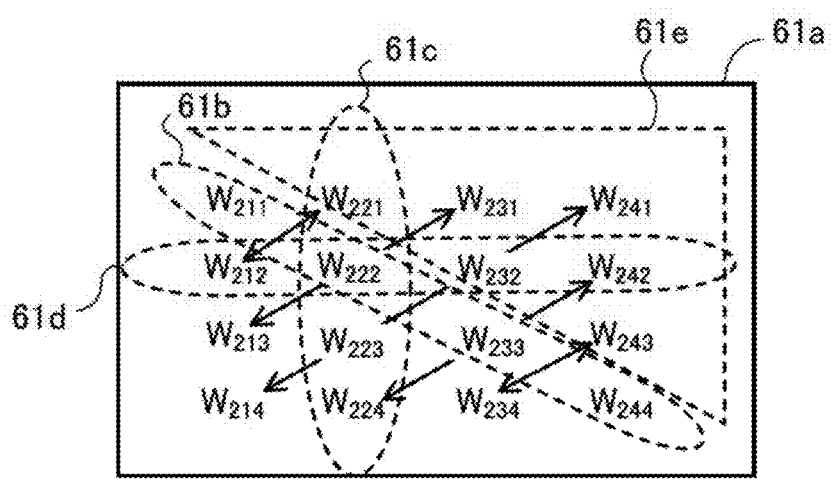
FIG. 11 illustrates examples of weight values indicating 3-body coupling.

FIG. 11 illustrates examples of weight values indicating 3-body coupling.

FIG. 11 illustrates a weight value group 61a including a plurality of weight values each of which indicates 3-body coupling of three neurons including the neuron whose neuron ID is 2 when the number of neurons is 4. For example, $W_{231}$ is a weight value that indicates 3-body coupling of the three neurons whose neuron IDs are 2, 3, and 1, respectively.

By extending the above two conditions of the Boltzmann machine to these weight values that indicate 3-body coupling, the following relationships are obtained: $W_{ijk}=0$ (when i=j, i=k, or j=k or i=j=k) and $W_{ijk}=W_{ikj}=W_{jik}=W_{jki}=W_{kij}=W_{kji}$ (i, j, and k are each a natural number not less than 1 and not more than n).

Thus, $W_{221}=W_{212}$, $W_{231}=W_{213}$, $W_{241}=W_{214}$, $W_{242}=W_{224}$, $W_{243}=W_{234}$. In addition, each of the weight values in weight value groups 61b, 61c, and 61d in FIG. 11 are 0.

In view of the above features, when the ising device 2 or 2a according to the present embodiment calculates a local field value $h_{23}$ generated by 3-body coupling that includes the neuron whose neuron ID is 2, the ising device 2 or 2a uses the weight values in a triangular domain 61e in FIG. 11 (six weight values in the example in FIG. 11).

Figure 12:
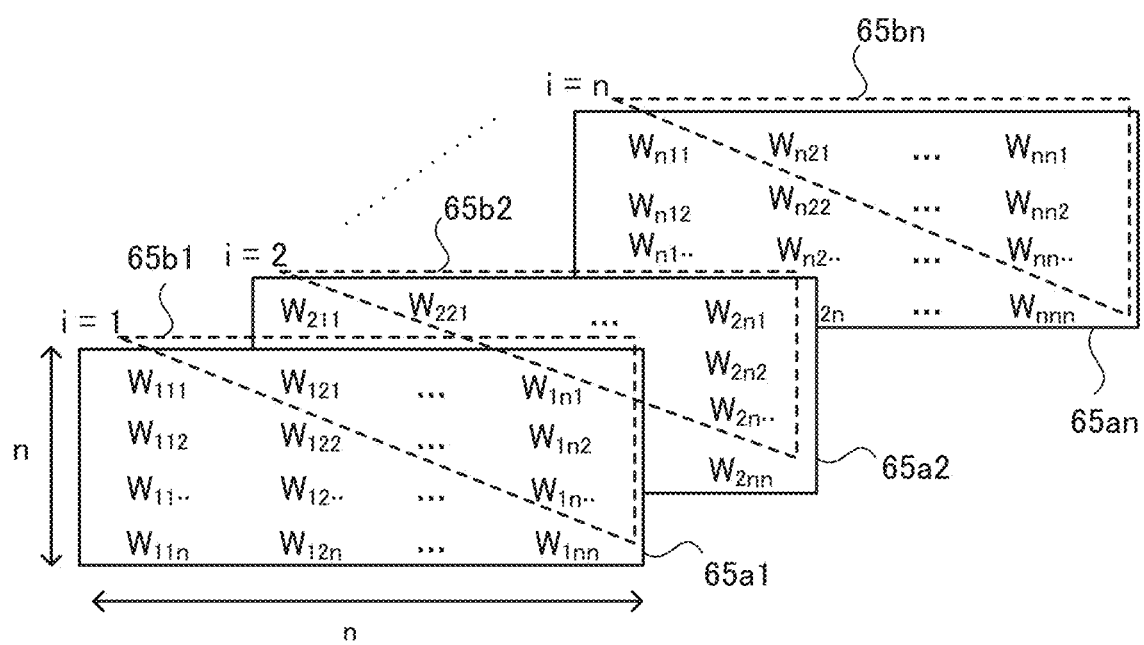
FIG. 12 illustrates examples of weight values indicating 3-body coupling when the number of neurons is n.

FIG. 12 illustrates examples of weight values indicating 3-body coupling when the number of neurons is n.

FIG. 12 illustrates weight value groups 65a1, 65a2, . . . , and 65an including weight values $W_{ijk}$ (i, j, and k are each a natural number not less than 1 and not more than n) each of which indicates 3-body coupling.

The weight value group 65a1 includes weight values $W_{1jk}$ in which i is 1, the weight value group 65a2 includes weight values $W_{2jk}$ in which i is 2, and the weight value group 65an includes weight values $W_{njk}$ in which i is n.

When the ising device 2 or 2a according to the present embodiment calculates the local field value $h_{i3}$, the ising device 2 or 2a uses only the weight values in triangular domains 65b1, 65b2, . . . , and 65bn in the weight value groups 65a1 to 65an. Namely, in the case of the weight value group 65a1, of all the weight values arranged in a matrix in FIG. 12, a plurality of weight values on a diagonal line (for example, weight values $W_{111}$, $W_{122}$, . . . , and $W_{1nn}$) and a plurality of weight values arranged under the diagonal line are not used.

The number of weight values included in each of the triangular domains 65b1 to 65bn is expressed as Nw by expression (6).

$$Nw = \frac{n^2 - n}{2} \qquad (6)$$

The value Nw is obtained by subtracting the number (n) of weight values on the above diagonal line from the number (n×n) of weight values included in one of the weight value groups 65a1 to 65an and dividing the obtained value by half. Namely, when calculating the local field value $h_{i3}$, the ising device 2 or 2a uses Nw weight values per i.

Figure 13:
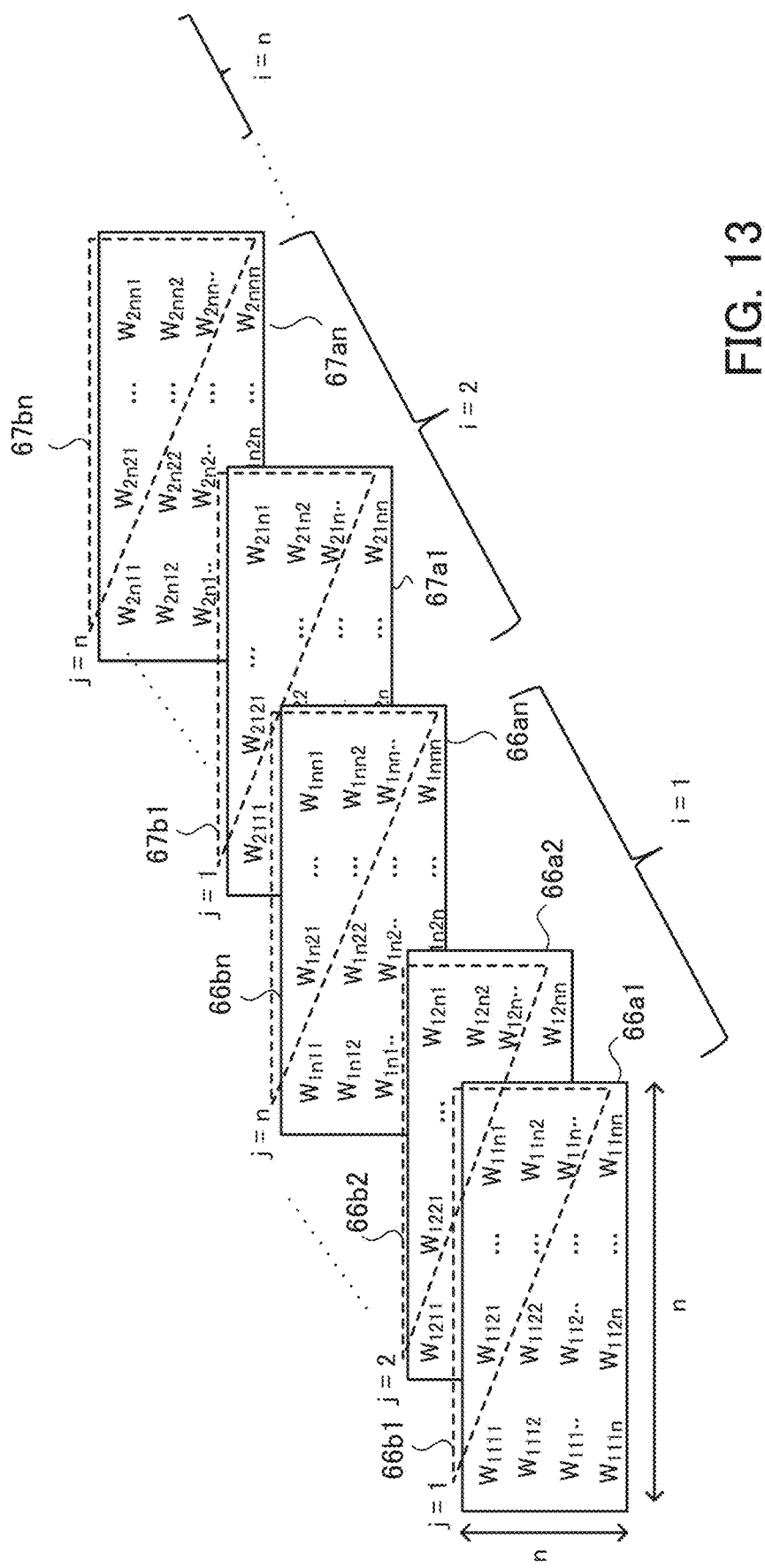
FIG. 13 illustrates examples of weight values indicating 4-body coupling when the number of neurons is n.

FIG. 13 illustrates examples of weight values indicating 4-body coupling when the number of neurons is n.

FIG. 13 illustrates weight value groups 66a1, 66a2, . . . , 66an, 67a1, . . . , and 67an including weight values $W_{ijkl}$ (i, j, k, and l are each a natural number not less than 1 and not more than n) each of which indicates 4-body coupling.

The weight value group 66a1 includes weight values $W_{11kl}$ in which i and j are each 1, and the weight value group 66a2 includes weight values $W_{12kl}$ in which i and j are 1 and 2, respectively, and the weight value group 66an includes weight values $W_{1nkl}$ in which i is 1 and j is n. In addition, the weight value groups 67a1 to 67an include weight values $W_{21kl}$ to $W_{2nkl}$ in which i is 2 and j is one of 1 to n.

When calculating a local field value $h_{i4}$, the ising device 2 uses only the weight values included in triangular domains 66b1, 66b2, 66bn, 67b1, . . . , and 67bn in the weight value groups 66a1 to 66an and 67a1 to 67an. The number of weight values included in each of the triangular domains 66b1 to 66bn and 67b1 to 67bn is expressed as Nw by the above expression (6).

Namely, when calculating the local field value $h_{i4}$, the ising device 2 uses (n×Nw) weight values generated by 4-body coupling per i.

In view of the above aspect, when d≥3, the number of weight values indicating d-body coupling per i is expressed by the following expression (7).

$$n^{d-3} \times Nw = n^{d-3} \times \frac{n^2 - n}{2} \quad (7)$$

On the basis of the above contents, the control device 3 generates weight value lists to be written in registers in the arithmetic circuits 11a1 to 11a(d−1) in the following procedure, for example.

Figure 14:
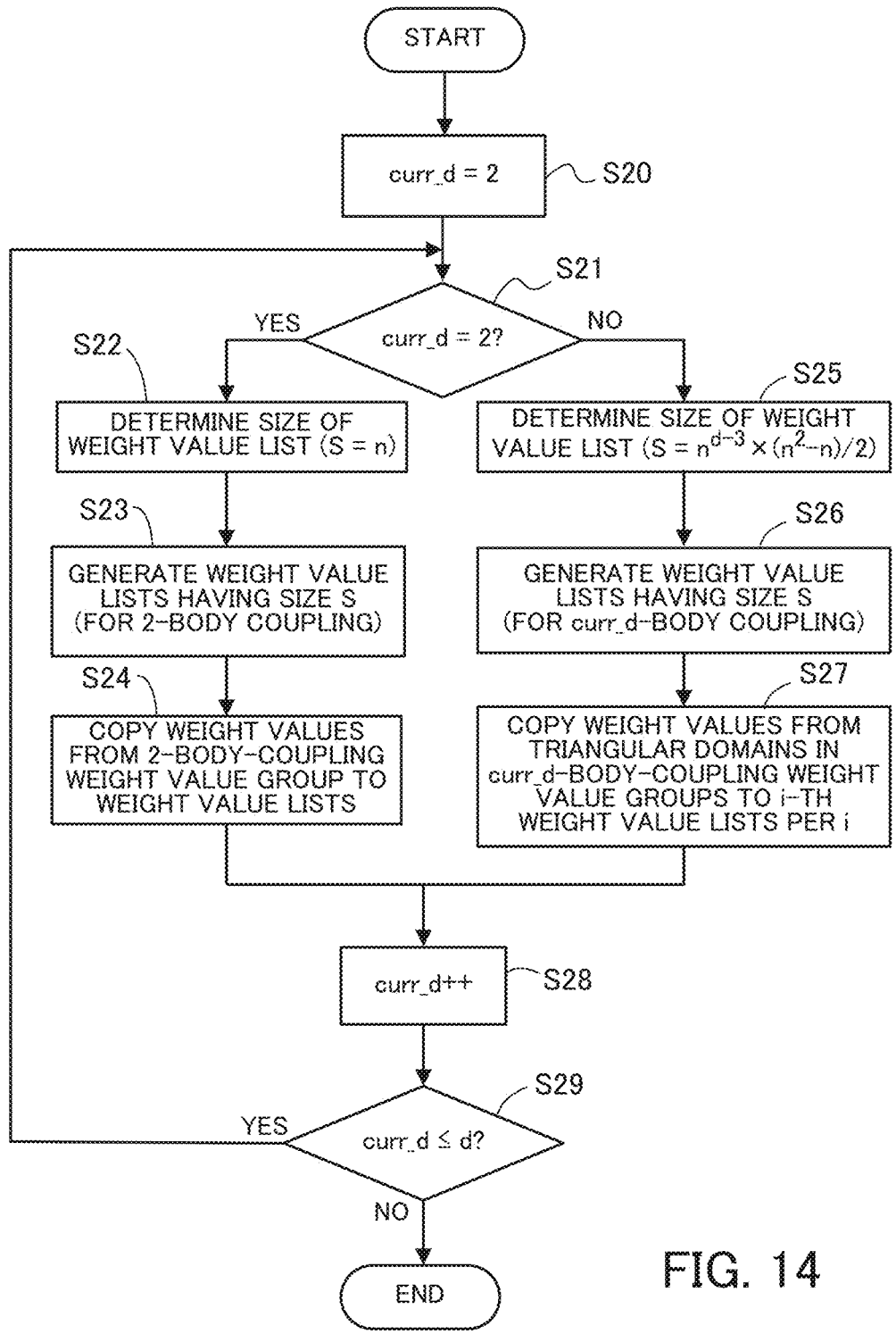
FIG. 14 is a flowchart illustrating an example of weight value list generation processing.

FIG. 14 is a flowchart illustrating an example of weight value list generation processing.

The following description assumes that a plurality of weight values, such as those illustrated in FIGS. 10 to 13, have already been stored in the memory 4.

First, the control device 3 sets a variable curr_d to 2 (step S20). Next, the control device 3 determines whether the variable curr_d is 2 (step S21).

When the variable curr_d is 2 (step S21: YES), the control device 3 determines a size S of an individual weight value list to be n, which is the same as the number of neurons (step S22). When $W_{ii}$ (the weight value=0) is not used, the size S may be n−1.

After step S22, the control device 3 generates weight value lists having the size S for 2-body coupling (step S23). The control device 3 generates n weight value lists having the size S. The generated weight value lists are stored in the memory 4, for example.

In addition, the control device 3 extracts the weight values, each of which indicates 2-body coupling of two neurons including the neuron whose neuron ID is i, from the 2-body-coupling weight value group stored in the memory 4 and copies the extracted weight values in the i-th weight value list of the n weight value lists (step S24). The control device 3 performs this processing per i.

For example, when n=4, the control device 3 copies the weight values $W_{12}$, $W_{13}$, and $W_{14}$, each of which indicates 2-body coupling of two neurons including the neuron whose neuron ID is 1, from the weight value group 60a as illustrated in FIG. 10 to the first weight value list. In addition, the control device 3 copies the weight values $W_{21}$, $W_{23}$, and $W_{24}$, each of which indicates 2-body coupling of two neurons including the neuron whose neuron ID is 2, from the weight value group 60a to the second weight value list. In addition, the control device 3 copies the weight values $W_{31}$, $W_{32}$, and $W_{34}$, each of which indicates 2-body coupling of two neurons including the neuron whose neuron ID is 3, from the weight value group 60a to the third weight value list. In addition, the control device 3 copies the weight values $W_{41}$, $W_{42}$, and $W_{43}$, each of which indicates 2-body coupling of two neurons including the neuron whose neuron ID is 4, from the weight value group 60a to the fourth weight value list.

In contrast, when the variable curr_d is not 2 (step S21: NO), the control device 3 calculates a size S of an individual weight value list on the basis of expression (7) (step S25).

After step S25, the control device 3 generates weight value lists having the size S for curr_d-body coupling (step S26). The control device 3 generates n weight value lists having the size S for curr_d-body coupling. The generated weight value lists are stored in the memory 4, for example.

In addition, the control device 3 extracts the weight values, each of which indicates curr_d-body coupling of curr_d neurons including the neuron whose neuron ID is i, from the curr_d-body-coupling weight value groups and copies the extracted weight values in the i-th weight value lists (step S27). In this step, in the curr_d-body-coupling weight value groups, the control device 3 copies only a plurality of weight values, such as those that are included in the triangular domains 66b1 to 66bn illustrated in FIG. 13. The control device 3 performs this processing per i.

Figure 15:
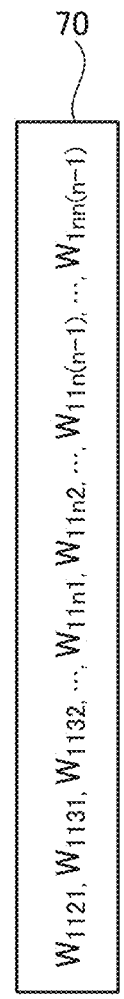
FIG. 15 illustrates an example of a weight value list.

FIG. 15 illustrates an example of a weight value list.

FIG. 15 illustrates an example of a weight value list 70 (i=1) generated when curr_d=4. Of all the weight values $W_{1121}$ to $W_{1nn(n-1)}$ copied in the weight value list 70, the weight values $W_{1121}$ to $W_{11n(n-1)}$ are included in the triangular domain 66b1 illustrated in FIG. 13 and the number of weight values $W_{1121}$ to $W_{11n(n-1)}$ is Nw. The other weight values in the weight value list 70 are included in the triangular domains 66b2 to 66bn illustrated in FIG. 13. Thus, the weight value list 70 includes n×Nw weight values.

After step S24 or S27 in FIG. 14, the control device 3 increments the variable curr_d (step S28) and determines whether curr_d d (step S29).

When curr_d≤d (step S29: YES), the control device 3 returns to step S21. Otherwise (step S29: NO), the control device 3 ends the weight value list generation processing.

The above description has been made assuming that the control device 3 generates the weight value lists. However, the present embodiment is not limited to this example. The weight value lists may be transmitted from an apparatus other than the information processing apparatus 1 via a network to the information processing apparatus 1, and the transmitted weight value lists may be stored in the memory 4. Examples of this source apparatus include a client apparatus such as a client computer operated by a user and a server apparatus such as a server computer.

The control device 3 writes the weight values included in the above weight value lists in registers in the arithmetic circuits 11a1 to 11a(d−1) illustrated in FIG. 1, for example.

For example, the weight values in the weight value lists (i=1 to n) generated when curr_d=d (d≥3) are written in the registers 30a1 to 30an in the arithmetic circuit 11a(d−1) illustrated in FIG. 2. For example, the weight values in the weight value list (i=1) are written in the register 30a1, and the weight values in the weight value list (i=n) are written in the register 30an. Thus, the number of weight values written in an individual one of the registers 30a1 to 30an is a number expressed by the above expression (7).

As described above, for example, on the basis of the symmetry of a plurality of weight values, the number of weight values written in an individual one of the registers 30a1 to 30an is limited by a number expressed by expression (7). Thus, increase of the size of the registers 30a1 to 30an is prevented. In addition, since the number of weight values used is limited, increase of the number m of the multiplier circuits 32a1 to 32am in the multiplier unit 32 and the number p of the adder circuits 33a1 to 33ap in the adder unit 33 that calculate a local field value by using the weight values is also prevented.

The number m of the multiplier circuits 32a1 to 32am is expressed by expression (8).

$$m = (d-1) \times n^{d-3} \times Nw \quad (8)$$

In addition, the number p of the adder circuit 33a1 to 33ap is expressed by expression (9).

$$p = 2^{\lceil \log_2(n^{d-3} \times N_w) \rceil} \times \sum_{i=1}^{\lceil \log_2(n^{d-3} \times N_w) \rceil} \left(\frac{1}{2}\right)^i \quad (9)$$

Second Embodiment

Figure 16:
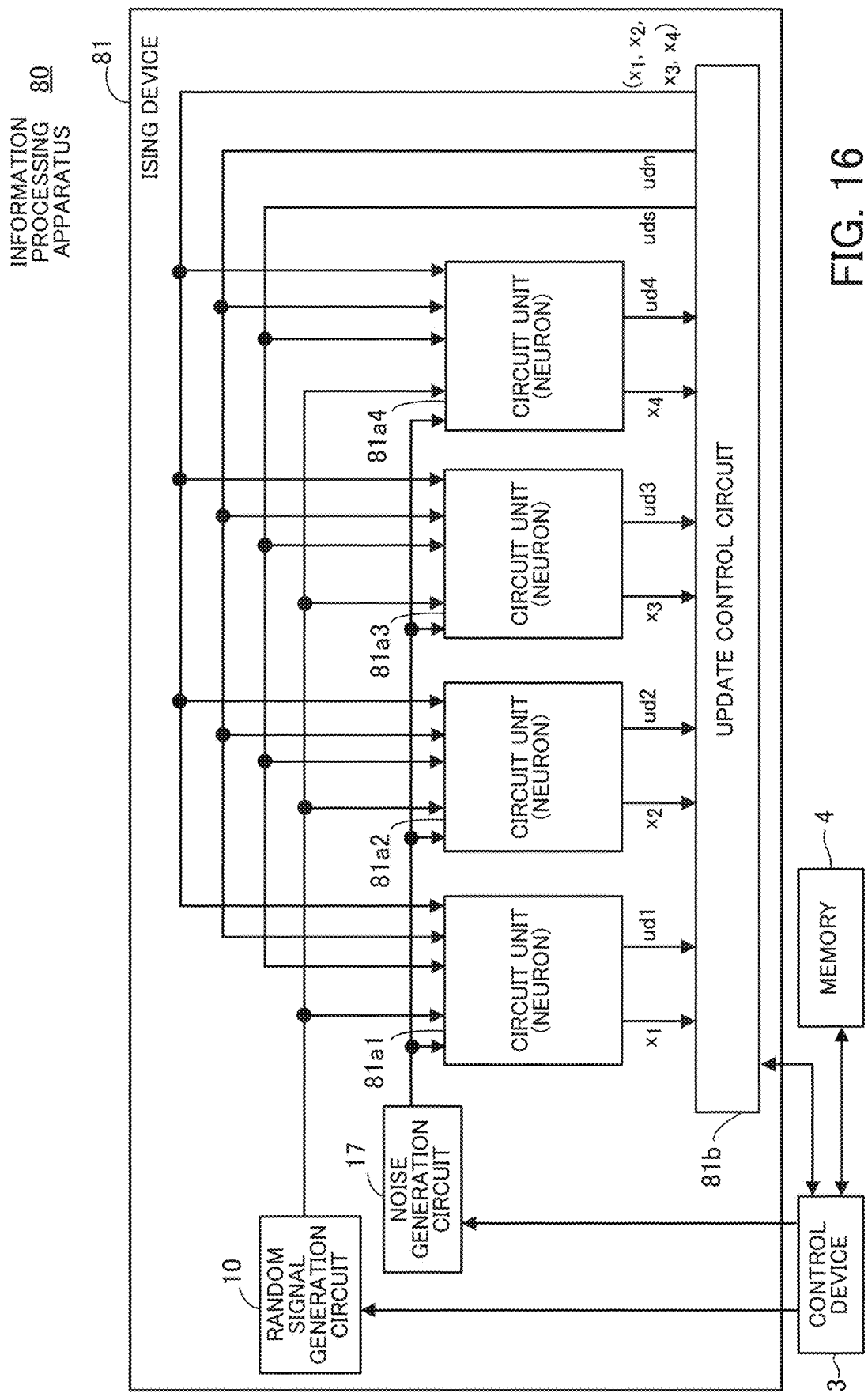
FIG. 16 illustrates an example of an information processing apparatus according to a second embodiment.

FIG. 16 illustrates an example of an information processing apparatus 80 according to a second embodiment. In FIGS. 1 and 16, like reference characters refer to like elements.

The information processing apparatus 80 according to the second embodiment includes an ising device 81 including circuit units 81a1 to 81a4 and an update control circuit 81b.

Each of the circuit units 81a1 to 81a4 corresponds to a single neuron. As an individual one of the circuit units 81a1 to 81a4, for example, a circuit that performs processing on the basis of an algorithm called "DeGloria algorithm" may be used. In the example in FIG. 16, the number of circuit units 81a1 to 81a4 is 4, assuming that the number n of neurons is 4. However, a different number of circuit units may be used depending on the number n of neurons used.

Each of the circuit units 81a1 to 81a4 calculates the above local field value $h_i$ ($1 \le i \le 4$) on the basis of the weight values indicating 2-body to d-body coupling and 4-bit output values $x_1$, $x_2$, $x_3$, and $x_4$ of the four neurons. In addition, each of the circuit units 81a1 to 81a4 outputs 0 or 1 as one of the output values $x_1$ to $x_4$ on the basis of the result of a comparison between a sum of the local field value $h_i$ and a noise value and a threshold (for example, 0).

Each of the circuit units 81a1 to 81a4 performs the following processing on the basis of a DeGloria algorithm when calculating the local field value $h_i$.

Assuming that only the state of one of the neurons is allowed to be updated at a time, the neurons connected to this neuron perform addition or subtraction of the change amount caused by the updating on the original local field value $h_i$.

First, the circuit units 81a1 to 81a4 calculate the change amounts of the d−1 local field values indicating the energies generated by 2-body to d-body coupling, respectively, on the basis of the weight values indicating 2-body to d-body coupling, the output values $x_1$ to $x_4$, and a signal udn. The signal udn indicates the neuron ID of a neuron whose output value has been updated. In addition, each of the circuit units 81a1 to 81a4 calculates a sum of the change amounts of the d−1 local field values. Next, each of the circuit units 81a1 to 81a4 reverses the plus or minus of the sum on the basis of a signal uds, which is the updated output value of one of the neurons, and adds the reserved sum to the original sum. In this way, the original sum is updated. This updated sum corresponds to the local field value $h_i$. In addition, each of the circuit units 81a1 to 81a4 has a function of holding a comparison result (output value) and a function of outputting one of the signals ud1 to ud4, which is set to 1 when the previous output value held differs from the current output value.

The update control circuit 81b operates under control of the control device 3. The update control circuit 81b receives the output values $x_1$ to $x_4$ and the signals ud1 to ud4 from the circuit units 81a1 to 81a4 and outputs the signal udn indicating the neuron ID of the neuron whose output value has been updated, the signal uds indicating the updated output value, and the output values $x_1$ to $x_4$.

Figure 17:
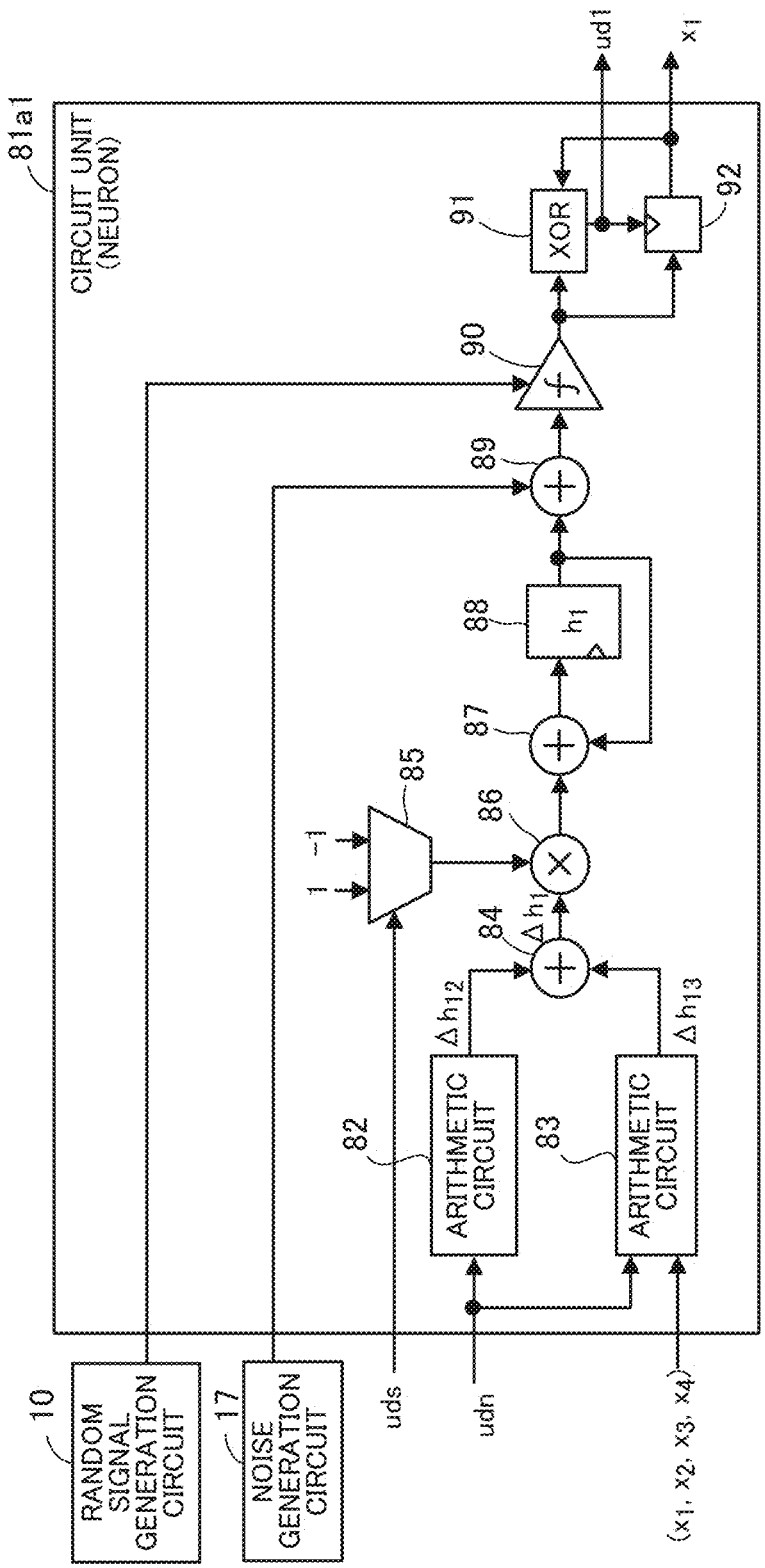
FIG. 17 illustrates an example of a circuit unit.

FIG. 17 illustrates an example of a circuit unit.

More specifically, FIG. 17 illustrates an example of the circuit unit 81a1 when d=3. The circuit units 81a2 to 81a4 are configured in the same way.

The circuit unit 81a1 includes arithmetic circuits 82 and 83, an adder circuit 84, a selector circuit 85, a multiplier circuit 86, an adder circuit 87, a register 88, an adder circuit 89, a comparator circuit 90, an XOR circuit 91, and a register 92.

The arithmetic circuit 82 calculates a change amount $\Delta h_{12}$ of a local field value generated by 2-body coupling of two neurons including a neuron whose neuron ID is 1.

For example, the change amount $\Delta h_{12}$ when the output value of a neuron whose neuron ID is 3 is updated is expressed by expression (10).

$$\Delta h_{12} = \frac{\partial h_{12}}{\partial x_3} = \frac{\partial (W_{12}x_2 + W_{13}x_3 + W_{14}x_4)}{\partial x_3} = W_{13} \quad (10)$$

As expressed by expression (10), when calculating the change amount $\Delta h_{12}$ of the local field value generated by 2-body coupling, the arithmetic circuit 82 does not need the output values $x_1$ to $x_4$.

The arithmetic circuit 83 calculates a change amount $\Delta h_{13}$ of a local field value generated by 3-body coupling of three neurons including the neuron whose neuron ID is 1.

For example, the change amount $\Delta h_{13}$ when the output value of the neuron whose neuron ID is 3 is updated is expressed by expression (11).

$$\Delta h_{13} = \quad (11)$$
$$\frac{\partial h_{13}}{\partial x_3} = \frac{\partial (W_{123}x_2x_3 + W_{124}x_2x_4 + W_{134}x_3x_4)}{\partial x_3} = W_{123}x_2 + W_{134}x_4$$

As expressed by expression (11), when calculating the change amount $\Delta h_{13}$ of the local field value generated by 3-body coupling, the arithmetic circuit 82 uses two of the output values $x_1$ to $x_4$.

For example, the arithmetic circuits 82 and 83 may be realized by the following circuits.

Figure 18:
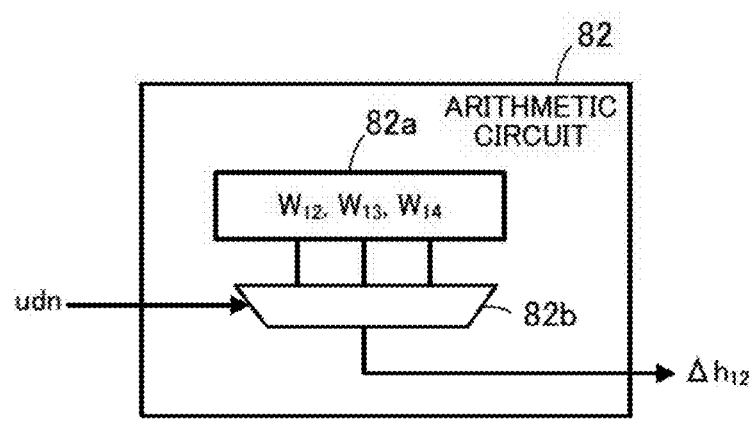
FIG. 18 illustrates an example of an arithmetic circuit that calculates a change amount of a local field value generated by 2-body coupling.

FIG. 18 illustrates an example of the arithmetic circuit 82 that calculates a change amount of a local field value generated by 2-body coupling.

The arithmetic circuit 82 includes a register 82a and a selector circuit 82b.

The register 82a holds weight values $W_{12}$ to $W_{14}$, each of which indicates 2-body coupling of two neurons including the neuron whose neuron ID is 1. The control device 3 writes the weight values $W_{12}$ to $W_{14}$ in the register 82a in accordance with the above processing.

The selector circuit 82b selects one of the weight values $W_{12}$ to $W_{14}$ on the basis of the signal udn and outputs the selected weight value as the change amount $\Delta h_{12}$ of the local field value. For example, when the selector circuit 82b receives a signal udn indicating that the output value of the neuron whose neuron ID is 3 has been updated, since the change amount $\Delta h_{12}$ is expressed by expression (10), the selector circuit 82b selects and outputs the weight value $W_{13}$. When the selector circuit 82b receives a signal udn indicating that the output value of the neuron whose neuron ID is 2 has been updated, the selector circuit 82b selects and outputs the weight value $W_{12}$. When the selector circuit 82*b* receives a signal udn indicating that the output value of the neuron whose neuron ID is 4, the selector circuit 82*b* selects and outputs the weight value $W_{14}$.

Figure 19:
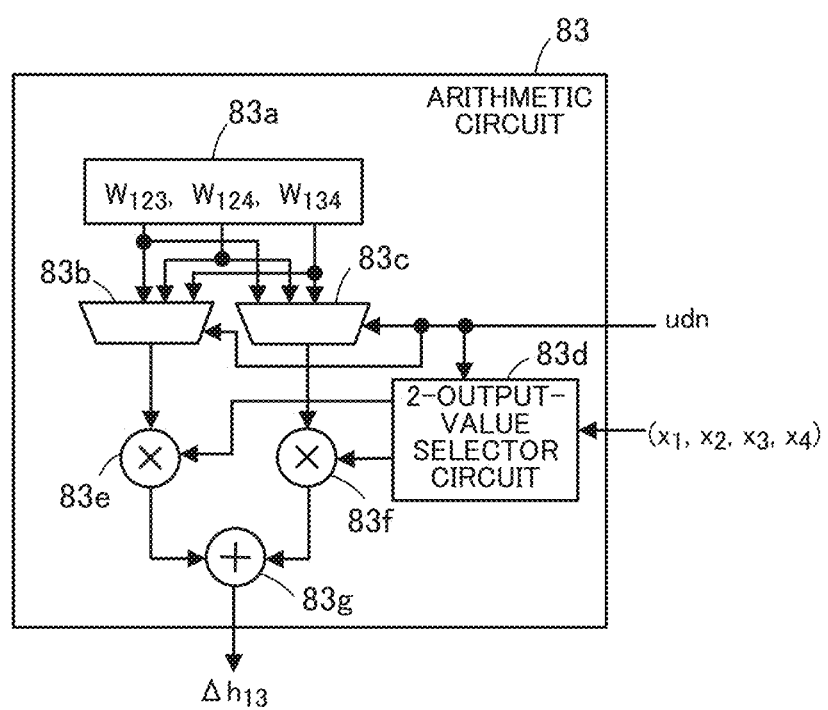
FIG. 19 illustrates an example of an arithmetic circuit that calculates a change amount of a local field value generated by 3-body coupling.

FIG. 19 illustrates an example of the arithmetic circuit 83 that calculates a change amount of a local field value generated by 3-body coupling.

The arithmetic circuit 83 includes a register 83*a*, selector circuits 83*b* and 83*c*, a 2-output-value selector circuit 83*d*, multiplier circuits 83*e* and 83*f*, and an adder circuit 83*g*.

When d=3 and n=4, the number of weight values, each of which indicates 3-body coupling of three neurons including the neuron whose neuron ID is 1, is 3, as expressed by expression (7).

Thus, the register 83*a* holds weight values $W_{123}$, $W_{124}$, and $W_{134}$, each of which indicates 3-body coupling of three neurons including the neuron whose neuron ID is 1. The control device 3 writes the weight values $W_{123}$ to $W_{134}$ in the register 83*a* in accordance with the above processing.

The selector circuit 83*b* selects one of the weight values $W_{123}$ to $W_{134}$ on the basis of the signal udn and outputs the selected weight value. The selector circuit 83*c* also selects one of the weight values $W_{123}$ to $W_{134}$ on the basis of the signal udn and outputs the selected weight value.

For example, when the selector circuits 83*b* and 83*c* receive a signal udn indicating that the output value of the neuron whose neuron ID is 3 has been updated, since the change amount $\Delta h_{13}$ is expressed by expression (11), the selector circuits 83*b* and 83*c* select and output the weight values $W_{123}$ and $W_{134}$, respectively. When the selector circuits 83*b* and 83*c* receive a signal udn indicating that the output value of the neuron whose neuron ID is 2 has been updated, the selector circuits 83*b* and 83*c* select and output the weight values $W_{123}$ and $W_{124}$, respectively. When the selector circuits 83*b* and 83*c* receive a signal udn indicating that the output value of the neuron whose neuron ID is 4, the selector circuits 83*b* and 83*c* select and output the weight values $W_{124}$ and $W_{134}$, respectively.

The 2-output-value selector circuit 83*d* selects two of the output values $x_1$ to $x_4$ on the basis of the signal udn and outputs the selected output value.

For example, when the 2-output-value selector circuit 83*d* receives a signal udn indicating that the output value of the neuron whose neuron ID=3 has been updated, since the change amount $\Delta h_{13}$ is expressed by expression (11), the 2-output-value selector circuit 83*d* selects and outputs the output values $x_2$ and $x_4$. In addition, when the 2-output-value selector circuit 83*d* receives a signal udn indicating that the output value of the neuron whose neuron ID=2 has been updated, the 2-output-value selector circuit 83*d* selects and outputs the output values $x_3$ and $x_4$. When the 2-output-value selector circuit 83*d* receives a signal udn indicating that the output value of the neuron whose neuron ID=4 has been updated, the 2-output-value selector circuit 83*d* selects and outputs the output values $x_2$ and $x_3$.

The 2-output-value selector circuit 83*d* is realized by the following circuit, for example.

Figure 20:
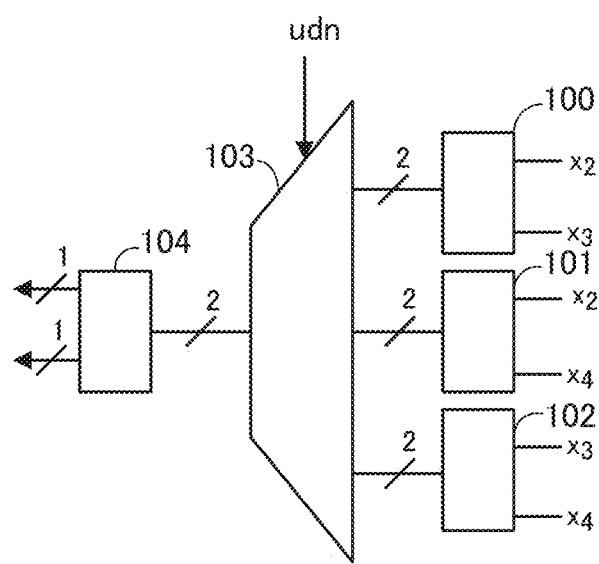
FIG. 20 illustrates an example of a two-output-value selector circuit.

FIG. 20 illustrates an example of the 2-output-value selector circuit 83*d*.

The 2-output-value selector circuit 83*d* includes registers 100 to 102, a selector circuit 103, and a register 104.

The register 100 holds the output values $x_2$ and $x_3$ and outputs the output values $x_2$ and $x_3$ as 2-bit signals. The register 101 holds the output values $x_2$ and $x_4$ and outputs the output values $x_2$ and $x_4$ as 2-bit signals. The register 102 holds the output values $x_3$ and $x_4$ and outputs the output values $x_3$ and $x_4$ as 2-bit signals.

The selector circuit 103 selects the signals outputted from one of the registers 100 to 102 on the basis of the signal udn and outputs the selected signals.

For example, when the selector circuit 103 receives a signal udn indicating that the output value of the neuron whose neuron ID is 4 has been updated, the selector circuit 103 selects and outputs the 2-bit signals outputted from the register 100. When the selector circuit 103 receives a signal udn indicating that the output value of the neuron whose neuron ID is 3 has been updated, the selector circuit 103 selects and outputs the 2-bit signals outputted from the register 101. When the selector circuit 103 receives a signal udn indicating that the output value of the neuron whose neuron ID is 2 has been updated, the selector circuit 103 selects and outputs the 2-bit signals outputted from the register 102.

The register 104 holds the 2-bit signals outputted by the selector circuit 103 and outputs these signals in parallel.

Since the arithmetic circuit 83 included in the circuit unit 81*a*1 corresponding to the neuron whose neuron ID is 1 does not use the output value $x_1$, the output value $x_1$ is not illustrated in FIG. 20.

The multiplier circuit 83*e* in FIG. 19 outputs a product of the weight value outputted by the selector circuit 83*b* and one of the output values $x_2$ to $x_4$ outputted by the 2-output-value selector circuit 83*d*. For example, when the selector circuit 83*b* and the 2-output-value selector circuit 83*d* receive a signal udn indicating that the output value of the neuron whose neuron ID is 3 has been updated, since the change amount $\Delta h_{13}$ is expressed by expression (11), the multiplier circuit 83*e* outputs a product of the weight value $W_{123}$ and the output value $x_2$.

The multiplier circuit 83*f* outputs a product of the weight value outputted by the selector circuit 83*c* and one of the output values $x_2$ to $x_4$ outputted by the 2-output-value selector circuit 83*d*. For example, when the selector circuit 83*c* and the 2-output-value selector circuit 83*d* receive a signal udn indicating that the output value of the neuron whose neuron ID is 3 has been updated, since the change amount $\Delta h_{13}$ is expressed by expression (11), the multiplier circuit 83*f* outputs a product of the weight value $W_{134}$ and the output value $x_4$.

The adder circuit 83*g* calculates a sum of the output values of the multiplier circuits 83*e* and 83*f* and outputs the sum as the change amount $\Delta h_{13}$.

The following description will be made with reference to FIG. 17 again.

The adder circuit 84 calculates a sum of the change amounts $\Delta h_{12}$ and $\Delta h_{13}$ calculated by the arithmetic circuits 82 and 83 and outputs the sum as a change amount $\Delta h_i$ of a local field value $h_1$.

The selector circuit 85 selects and outputs 1 or −1 on the basis of the signal uds, which is the updated output value of the neuron whose output value has been updated. When the updated output value is 0, the selector circuit 85 selects and outputs −1. When the updated output value is 1, the selector circuit 85 selects and outputs 1.

The multiplier circuit 86 outputs a product of the change amount $\Delta h_1$ outputted by the adder circuit 84 and the value outputted by the selector circuit 85.

The adder circuit 87 calculates and outputs a sum of the value outputted by the multiplier circuit 86 and the value (local field value $h_1$) stored in the register 88.

In synchronization with a clock signal (not illustrated), the register 88 captures the value outputted by the adder circuit 87 and updates the local field value $h_1$. The register

88 includes a flip flop, for example. The register 88 holds a bias value $b_1$ as an initial value.

The adder circuit 89 calculates a sum of the noise value outputted by the noise generation circuit 17 and the value outputted by the register 88 and outputs the sum.

For example, the comparator circuit 90 outputs 0 when the value outputted by the adder circuit 89 is equal to or more than a threshold. For example, the comparator circuit 90 outputs 1 when the value outputted by the adder circuit 89 is smaller than the threshold.

The comparator circuit 90 is enabled or disenabled by the selection signal outputted by the random signal generation circuit 10. When performing an annealing operation, the ising device 81 allows only one neuron to update its output value. Thus, such comparator circuit 90 as described above is used. For example, on the basis of the signal outputted by the random signal generation circuit 10, only one of the comparator circuits in the circuit units 81a1 to 81a4 is randomly selected and enabled (for example, the comparator circuit 90 in the circuit unit 81a1). The other comparator circuits are disenabled.

The XOR circuit 91 is an exclusive-OR circuit that outputs 0 as the signal ud1 when the value outputted by the comparator circuit 90 is the same as the value stored in the register 92 and that outputs 1 as the signal ud1 when these values are different.

When the signal ud1 represents 1, the register 92 captures the value outputted by the comparator circuit 90. In this way, the output value $x_1$ of the circuit unit 81a1 is updated.

The above comparator circuit 90, XOR circuit 91, and register 92 realize functions equivalent to those of the comparator circuit 13, the update circuit 14, and the holding circuit 15 of the ising device 2 according to the first embodiment.

(Example of Operation of Information Processing Apparatus According to Second Embodiment)

Hereinafter, an example of an operation of the information processing apparatus 80 in FIG. 16 controlled by the control device 3 will be described with reference to a flowchart.

As with the information processing apparatus 1 according to the first embodiment, the information processing apparatus 80 according to the second embodiment performs processing similar to that as illustrated in FIG. 7. However, the simulated annealing performed by the information processing apparatus 80 is different from that performed by the information processing apparatus 1 in step S3 in FIG. 7 in accordance with the procedure as illustrated in FIG. 8. Next, an example of the simulated annealing performed by the information processing apparatus 80 according to the second embodiment will be described.

Figure 21:
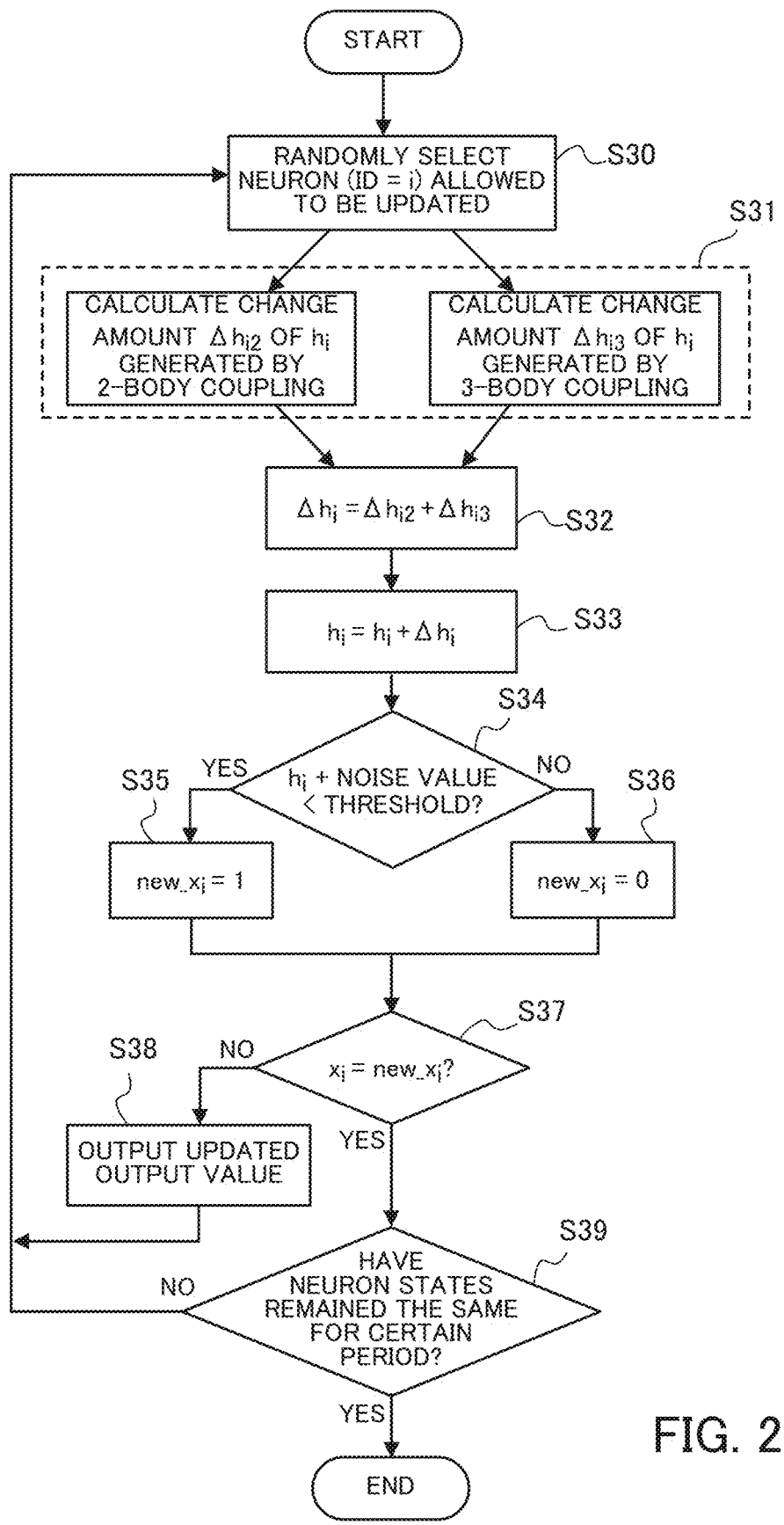
FIG. 21 is a flowchart illustrating an example of simulated annealing performed by the information processing apparatus according to the second embodiment.

FIG. 21 is a flowchart illustrating an example of the simulated annealing performed by the information processing apparatus 80 according to the second embodiment. The following description assumes that n=4 and d=3, namely, that the number of neurons is 4 and 2-body coupling and 3-body coupling are performed.

First, controlled by the control device 3, the random signal generation circuit 10 outputs a selection signal for randomly selecting a neuron (a neuron whose neuron ID=i) whose output value is allowed to be updated (step S30). For example, when the selection signal indicates the neuron whose neuron ID is 1, the comparator circuit 90 in the circuit unit 81a1 is enabled, and thus, the output value $x_1$ of the circuit unit 81a1 is allowed to be updated. In this case, the output value $x_2$ to $x_4$ of the circuit units 81a2 to 81a4 are not updated.

Each of the circuit units 81a1 to 81a4 calculates the change amount $\Delta h_{i2}$ of the local field value $h_i$ generated by 2-body coupling and the change amount $\Delta h_{i3}$ of the local field value $h_i$ generated by 3-body coupling (step S31). For example, in the circuit unit 81a1, the arithmetic circuit 82 calculates the change amount $\Delta h_{12}$ and the arithmetic circuit 83 calculates the change amount $\Delta h_{13}$.

Next, each of the circuit units 81a1 to 81a4 calculates a sum of the change amounts $\Delta h_{i2}$ and $\Delta h_{i3}$ to obtain the change amount $\Delta h_i$ (step S32). For example, in the circuit unit 81a1, the adder circuit 84 calculates a sum of the change amounts $\Delta h_{12}$ and $\Delta h_{13}$ to obtain the change amount $\Delta h_1$.

Next, by adding the change amount $\Delta h_i$ to the original local field value $h_i$, each of the circuit units 81a1 to 81a4 updates the local field value $h_i$ (step S33). For example, in the circuit unit 81a1, the adder circuit 87 adds the change amount $\Delta h_i$ to the local field value $h_1$ stored in the register 88, to update the local field value $h_1$.

Next, when a sum of the local field value $h_i$ and the noise value is smaller than a threshold (step S34: YES), one of the circuit units 81a1 to 81a4 that corresponds to the neuron whose neuron ID is i sets new_$x_i$=1 (step S35).

When a sum of the local field value $h_i$ and the noise value is equal to or more than the threshold (step S34: NO), one of the circuit units 81a1 to 81a4 that corresponds to the neuron whose output value is allowed to be updated sets new_$x_i$=0 (step S36).

For example, assuming that the selection signal indicates selection of the neuron whose neuron ID is 1, when the sum of the local field value $h_1$ and the noise value is smaller than the threshold, the comparator circuit 90 in the circuit unit 81a1 outputs 1 as new_$x_1$. In contrast, when the sum of the local field value $h_1$ and the noise value is equal to or more than the threshold, the comparator circuit 90 outputs 0 as new_$x_1$.

After step S35 or S36, when new_$x_i$ differs from the original output value $x_i$ of the neuron whose neuron ID is i (step S37: NO), an updated output value obtained by updating the output value $x_i$ of the i-th circuit unit of the circuit units 81a1 to 81a4 is outputted (step S38).

For example, assuming that the selection signal indicates selection of the neuron whose neuron ID is 1, when new_$x_1$ differs from the original output value $x_1$ stored in the register 92, the XOR circuit 91 in circuit unit 81a1 sets the signal ud1 to 1. In this way, new_$x_1$ is stored in the register 92 and is outputted as a new output value $x_1$.

Next, the processing returns to step S30.

When new_$x_i$ is the same as the original output value $x_i$ (step S37: YES), for example, the control device 3 receives the output values $x_1$ to $x_4$ via the update control circuit 81b and determines whether the output values $x_1$ to $x_4$ (neuron states) have not changed for a certain period (step S39). If the output values $x_1$ to $x_4$ have not changed for the certain period (step S39: YES), the control device 3 ends the simulated annealing.

If the output values $x_1$ to $x_4$ have changed within the certain period (step S39: NO), the processing returns to step S30.

The simulated annealing is performed as the noise generation circuit 17 gradually drops the noise width under control of the control device 3 every time a neuron allowed to be updated is selected.

While the above description has been made assuming that n=4 and d=3, the present embodiment is not limited to this example. For example, when the change amount $\Delta h_{1d}$ of a local field value generated by d ($\geq 4$) body coupling is calculated, at least one arithmetic circuit that calculates $\Delta h_{id}$ is added, in addition of the arithmetic circuits 82 and 83. If the number of neurons is n, the arithmetic circuit that calculates $\Delta h_{i,d}$ uses d−1 output values among the output values $x_1$ to $x_n$ of the n neurons.

In the information processing apparatus 80 and the ising device 81 according to the second embodiment, the change amounts of the local field values generated by 2-body coupling to d-body coupling of 2 to d neurons are calculated, respectively. The local field value $h_i$ is updated on the basis of the value based on a sum of change amounts, and the output value of an individual neuron is determined on the basis of a result of the comparison between a sum of the updated local field value $h_i$ and a noise value and a threshold.

In this way, an optimization problem using a high-order energy function is mapped in the ising device 81 without using any ancillary bit. While addition of this ancillary bit could slow down the convergence into an optimal solution or decrease the number of usable bits in simulated annealing, the ising device 81 does not have these problems.

In addition, for example, an optimization problem using a high-order energy function does not need to be converted into an optimization problem using a plurality of second-order energy functions, an optimization problem is easily mapped in the ising device 81.

In addition, in the ising device 81 according to the second embodiment, the change amount $\Delta h_i$ of the local field value $h_i$ is calculated, and $h_i$ is updated by using the change amount $\Delta h_i$. Thus, the ising device 81 according to the second embodiment needs fewer adder circuits and multiplier circuits than those needed in the ising device 2 according to the first embodiment.

While one aspect of an individual information processing apparatus, ising device, and information processing apparatus control method has been described on the basis of embodiments, the above description represents only examples. The present technique is not limited to the above description.

The above information processing apparatus, ising device, and information processing apparatus control method enable mapping of an optimization problem using a high-order energy function, without using any ancillary bit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An information processing apparatus comprising:
    an ising device; and
    a control device,
    wherein the ising device includes:
    a random signal generation circuit that outputs, a plurality of times, a selection signal for randomly selecting a first neuron whose output value is allowed to be updated from n neurons, wherein n is a natural number of 3 or more,
    d-1 arithmetic circuits that calculate, based on a plurality of weight values indicating strength of each coupling from 2-body coupling to d-body coupling of two to d neurons including the first neuron selected from the n neurons based on the selection signal and n-bit output values of the n neurons, d-1 energy values for the first neuron indicating energies generated by the respective 2-body to d-body coupling of the two to d neurons including the first neuron or change amounts of the d-1 energy values for the first neuron, wherein d is a natural number not less than 3 and not more than n,
    an adder circuit that calculates a first sum by adding up the d-1 energy values or calculates a second sum by adding up the change amounts of the d-1 energy values and outputs the first sum or the second sum,
    a comparator circuit that determines and outputs a first output value of the first neuron, based on a first comparison result obtained by comparing a first value based on a sum of the first sum and a noise value with a threshold or based on a second comparison result obtained by comparing a third value with the threshold, the third value being based on a sum of a second value that indicates a sum of the energies generated by the respective 2-body to d-body coupling and that is updated based on the second sum and the noise value,
    an update circuit that outputs n-bit updated output values in which one bit has been updated based on the selection signal and the first output value, and
    a holding circuit that holds the n-bit updated output values and outputs the n-bit updated output values as the n-bit output values used by the arithmetic circuits, and
    wherein the control device controls a noise width of the noise value.

2. The information processing apparatus according to claim 1,
    wherein each of the d-1 arithmetic circuits includes a storage unit, and
    wherein the control device determines a number of weight values stored in the storage unit in accordance with symmetry of the weight values.

3. The information processing apparatus according to claim 2, wherein the control device sets the number of weight values stored in the storage unit, based on $n^{d-3} \times (n^2 - n)/2$.

4. An ising device comprising:
    a random signal generation circuit that outputs, a plurality of times, a selection signal for randomly selecting a first neuron whose output value is allowed to be updated from n neurons, wherein n is a natural number of 3 or more;
    d-1 arithmetic circuits that calculate, based on a plurality of weight values indicating strength of each coupling from 2-body coupling to d-body coupling of two to d neurons including the first neuron selected from the n neurons based on the selection signal and n-bit output values of the n neurons, d-1 energy values for the first neuron indicating energies generated by the respective 2-body to d-body coupling of the two to d neurons including the first neuron or change amounts of the d-1 energy values for the first neuron, wherein d is a natural number not less than 3 and not more than n;
    an adder circuit that calculates a first sum by adding up the d-1 energy values or calculates a second sum by adding up the change amounts of the d-1 energy values and outputs the first sum or the second sum;
    a comparator circuit that determines and outputs a first output value of the first neuron, based on a first comparison result obtained by comparing a first value based on a sum of the first sum and a noise value with a threshold or based on a second comparison result obtained by comparing a third value with the threshold, the third value being based on a sum of a second value that indicates a sum of the energies generated by the respective 2-body to d-body coupling and that is updated based on the second sum and the noise value;

an update circuit that outputs n-bit updated output values in which one bit has been updated based on the selection signal and the first output value; and a holding circuit that holds the n-bit updated output values and outputs the n-bit updated output values as the n-bit output values used by the arithmetic circuits.

5. An information processing apparatus control method comprising:

preparing an ising device including:

a random signal generation circuit that outputs, a plurality of times, a selection signal for randomly selecting a first neuron whose output value is allowed to be updated from n neurons, wherein n is a natural number of 3 or more, d-1 arithmetic circuits that calculate, based on a plurality of weight values indicating strength of each coupling from 2-body coupling to d-body coupling of two to d neurons including the first neuron selected from the n neurons based on the selection signal and n-bit output values of the n neurons, d-1 energy values for the first neuron indicating energies generated by the respective 2-body to d-body coupling of the two to d neurons including the first neuron or change amounts of the d-1 energy values for the first neuron, wherein d is a natural number not less than 3 and not more than n, an adder circuit that calculates a first sum by adding up the d-1 energy values or calculates a second sum by adding up the change amounts of the d-1 energy values and outputs the first sum or the second sum, a comparator circuit that determines and outputs a first output value of the first neuron, based on a first comparison result obtained by comparing a first value based on a sum of the first sum and a noise value with a threshold or based on a second comparison result obtained by comparing a third value with the threshold, the third value being based on a sum of a second value that indicates a sum of the energies generated by the respective 2-body to d-body coupling and that is updated based on the second sum and the noise value, an update circuit that outputs n-bit updated output values in which one bit has been updated based on the selection signal and the first output value, and a holding circuit that holds the n-bit updated output values and outputs the n-bit updated output values as the n-bit output values used by the arithmetic circuits;

causing a control device to set a plurality of weight values in the ising device; and causing the control device to control a noise width of the noise value.

6. The information processing apparatus according to claim 1, wherein the update circuit outputs the n-bit updated output values of the n neurons in which one bit, among the n-bit output values of the n neurons, has been updated based on the selection signal and the first output value.

* * * * *